US012684873B2

(12) United States Patent     (10) Patent No.:   US 12,684,873 B2

Xie et al.          (45) Date of Patent:     Jul. 14, 2026

(54) SELF-ALIGNED BACKSIDE INTERCONNECT STRUCTURES

(71) Applicant: International Business Machines Corporation, Armonk, NY (US)

(72) Inventors: Ruilong Xie, Niskayuna, NY (US); Brent A. Anderson, Jericho, VT (US); Albert M. Chu, Nashua, NH (US); Lawrence A. Clevenger, Saratoga Springs, NY (US); Nicholas Anthony Lanzillo, Wynantskill, NY (US); Reinaldo Vega, Mahopac, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 528 days.

(21) Appl. No.: 18/176,551

(22) Filed: Mar. 1, 2023

(65) Prior Publication Data

US 2024/0297167 A1     Sep. 5, 2024

(51) Int. Cl.
| | |
|---|---|
| *H10D 89/10* | (2025.01) |
| *H10D 84/90* | (2025.01) |
| *H10W 20/00* | (2026.01) |

(52) U.S. Cl.
CPC ........... *H10D 89/10* (2025.01); *H10D 84/907* (2025.01); *H10W 20/056* (2026.01); *H10D 84/931* (2025.01)

(58) Field of Classification Search
CPC .... H10D 89/10; H10D 84/907; H10D 84/931;
H01L 21/76877; H01L 21/76895; H01L 21/76897; H01L 21/743; H01L 23/5286; H01L 23/535; H10W 20/056; H10W 20/023; H10W 20/43
See application file for complete search history.

(56) References Cited

U.S. PATENT DOCUMENTS

| | | | |
|---|---|---|---|
| 10,636,739 B2 * | 4/2020 | Beyne | ................. H10D 84/856 |
| 10,892,215 B2 | 1/2021 | Nelson | |
| 11,183,419 B2 * | 11/2021 | Leobandung | ......... H01L 23/481 |

(Continued)

OTHER PUBLICATIONS

Intellectual Property Office, "Request for the Submission of an Opinion," Oct. 29, 2025, 13 Pages, KR Application No. 10-2025-7010943.

*Primary Examiner* — John M Parker
(74) *Attorney, Agent, or Firm* — Kimberly Zillig

(57) ABSTRACT

A semiconductor structure includes a first plurality of backside power rail interconnects located within a first cell height region of a substrate. A second plurality of backside power rail interconnects are located within a second cell height region of the substrate. A first isolation region is located between the first cell height region of the substrate and the second cell height region of the substrate. The first isolation region electrically separates the first cell height region and the second cell height region. A second isolation region is located between adjacent power rail interconnects of the first plurality of backside power rail interconnects and between adjacent power rail interconnects of the second plurality of backside power rail interconnects. The second isolation region electrically separates the adjacent power rail interconnects.

11 Claims, 35 Drawing Sheets

Section X

(56)         References Cited

U.S. PATENT DOCUMENTS

| | | | |
|---|---|---|---|
| 2013/0277785 A1* | 10/2013 | Chen | H10F 39/014 |
| | | | 257/432 |
| 2020/0152508 A1* | 5/2020 | Jourdain | H01L 21/463 |
| 2020/0266169 A1 | 8/2020 | Kang | |
| 2020/0411436 A1* | 12/2020 | Xie | H01L 21/02126 |
| 2021/0111115 A1 | 4/2021 | Patrick | |
| 2021/0118798 A1 | 4/2021 | Liebmann | |
| 2021/0134721 A1 | 5/2021 | Chiang | |
| 2021/0202385 A1 | 7/2021 | Huang | |
| 2021/0305252 A1 | 9/2021 | Chiang | |
| 2021/0305381 A1 | 9/2021 | Chiang | |
| 2021/0351303 A1* | 11/2021 | Ju | H01L 21/76897 |
| 2021/0376071 A1 | 12/2021 | Liu | |
| 2021/0376093 A1 | 12/2021 | Chu | |
| 2022/0130968 A1 | 4/2022 | Peng | |
| 2022/0180037 A1* | 6/2022 | Sherlekar | G06F 30/392 |
| 2022/0181258 A1* | 6/2022 | Liebmann | H10D 30/67 |
| 2022/0199608 A1 | 6/2022 | Peng | |
| 2022/0238442 A1 | 7/2022 | Sio | |
| 2022/0238443 A1 | 7/2022 | Peng | |
| 2022/0301878 A1 | 9/2022 | Xie | |
| 2022/0360263 A1 | 11/2022 | Sio | |
| 2023/0187353 A1* | 6/2023 | Ostermayr | H01L 23/535 |
| | | | 257/773 |

* cited by examiner

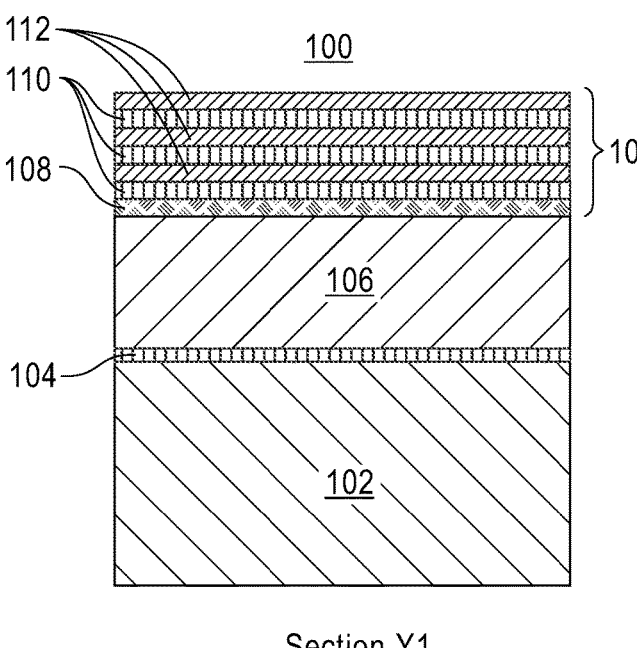
Section Y1
FIG. 2A
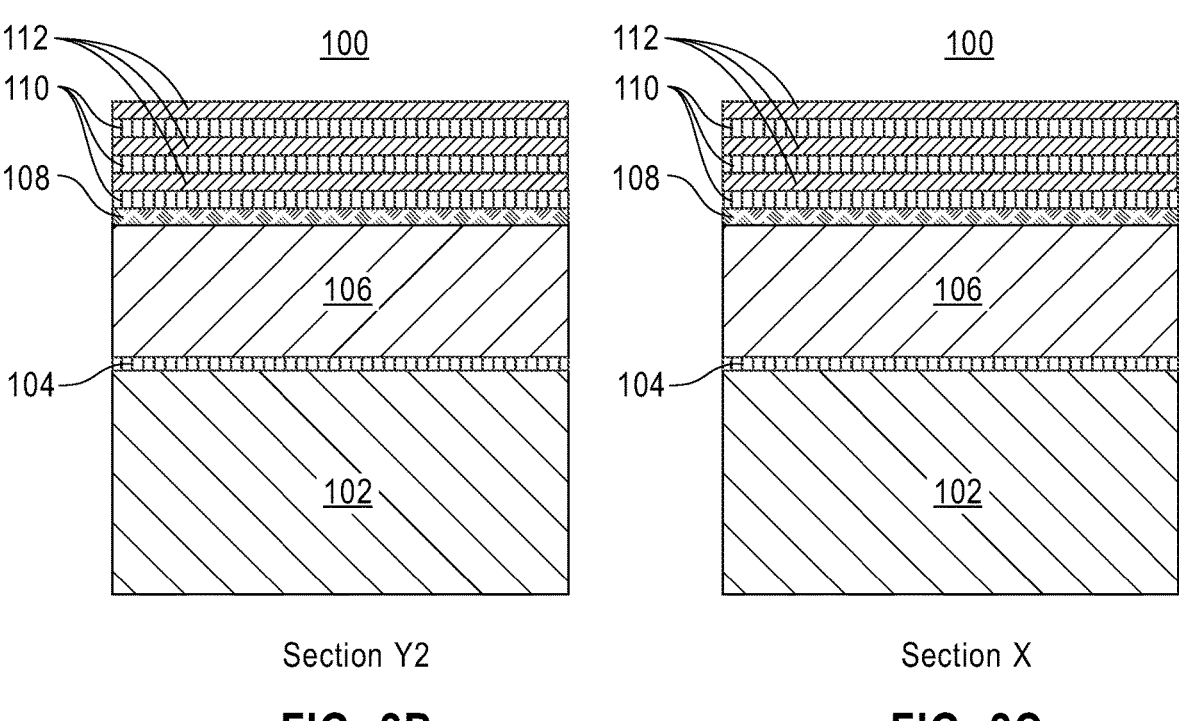
Section Y2
FIG. 2B
Section X
FIG. 2C

Section Y2

Section Y1

Section X

Section Y2

Section Y1

Section X

Section Y2

Section Y1

100

Section X

Section Y1

Section Y2

100

Section X

Section Y2

Section Y1

100

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section Y2

Section Y1

Section X

SELF-ALIGNED BACKSIDE INTERCONNECT STRUCTURES

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. However, existing BPR technology still faces various challenges including routing resistance, alignment margins, layout flexibility, and packing density.

SUMMARY

Shortcomings of the prior art are overcome and additional advantages are provided through the provision of a semiconductor structure, and a method of making the same, including self-aligned backside interconnect structures for flexible cell height integration.

According to an embodiment of the present disclosure, the semiconductor structure includes a first plurality of backside power rail interconnects located within a first cell height region of a substrate, a second plurality of backside power rail interconnects located within a second cell height region of the substrate, a first isolation region located between the first cell height region of the substrate and the second cell height region of the substrate, the first isolation region electrically separating the first cell height region and the second cell height region, and a second isolation region located between adjacent power rail interconnects of the first plurality of backside power rail interconnects and between adjacent power rail interconnects of the second plurality of backside power rail interconnects, the second isolation region electrically separating the adjacent power rail interconnects.

According to another embodiment of the present disclosure, the method of forming a semiconductor structure includes forming a first plurality of backside power rail interconnects within a first cell height region of a substrate, forming a second plurality of backside power rail interconnects within a second cell height region of the substrate, forming a first isolation region between the first cell height region of the substrate and the second cell height region of the substrate, the first isolation region electrically separating the first cell height region and the second cell height region, and forming a second isolation region between adjacent power rail interconnects of the first plurality of backside power rail interconnects and between adjacent power rail interconnects of the second plurality of backside power rail interconnects, the second isolation region electrically separating the adjacent power rail interconnects.

BRIEF DESCRIPTION OF THE DRAWINGS

The following detailed description, given by way of example and not intended to limit the invention solely thereto, will best be appreciated in conjunction with the accompanying drawings, in which:

FIG. 2A is a cross-sectional view of the semiconductor structure taken along line Y1-Y1', as depicted in FIG. 1, depicting forming a nanosheet stack, according to an embodiment of the present disclosure;

FIG. 2B is a cross-sectional view of the semiconductor structure taken along line Y2-Y2', as depicted in FIG. 1, according to an embodiment of the present disclosure;

FIG. 2C is a cross-sectional view of the semiconductor structure taken along line X-X', as depicted in FIG. 1, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
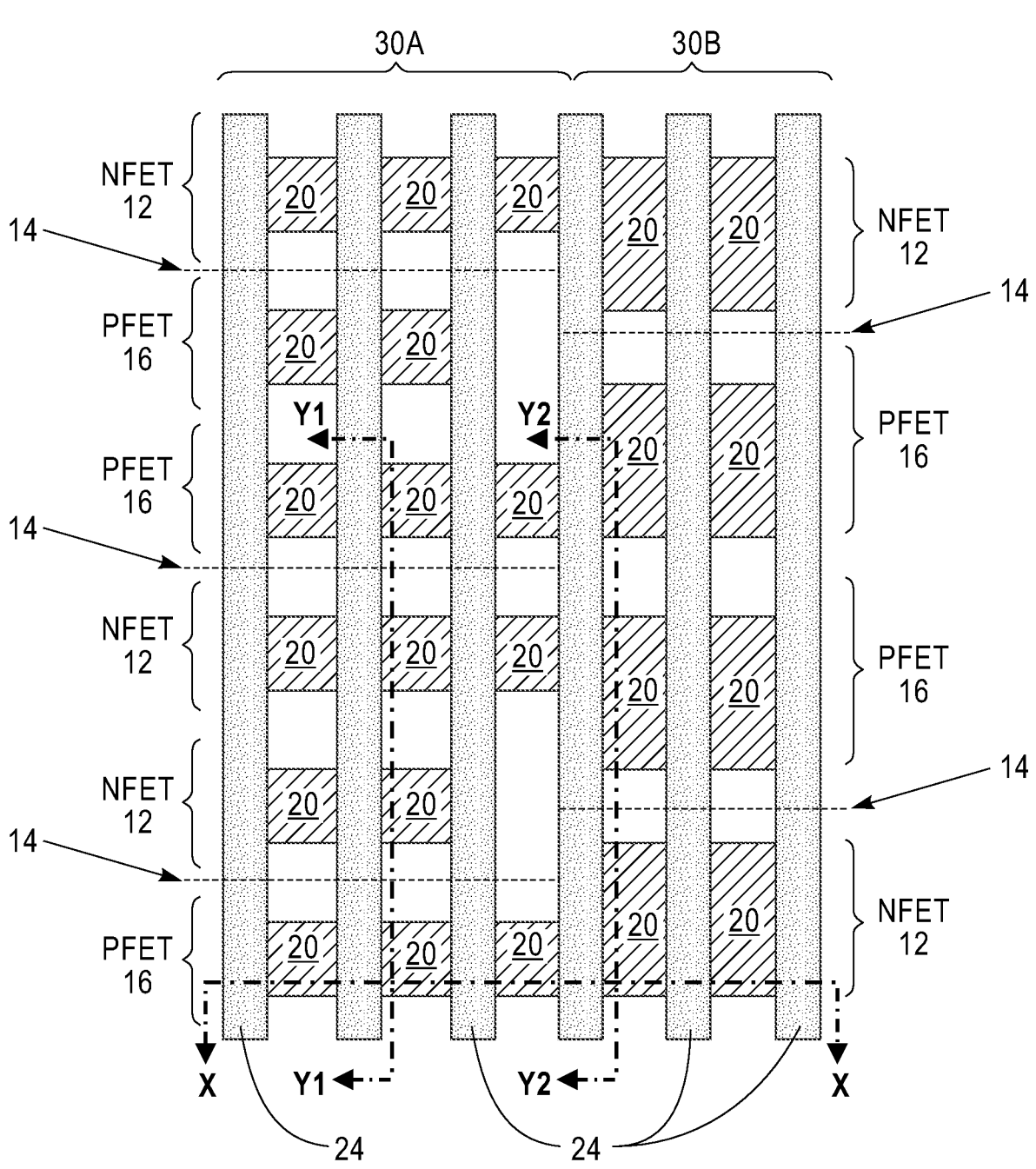
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes, and in some instances may have not been described in detail. In other instances, some processing steps or operations that are known in the art may not be described at all. It should be understood that the following description is focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Embodiments of the present disclosure provide a semiconductor structure, and a method of making the same, including backside metal contacts and backside power rails (BPRs) self-aligned with respect to shallow trench isolation (STI) and diffusion break isolation regions. The BPRs are electrically separated from one another at an N2P space by the STI and at an intersection between regions of different cell height by the diffusion break isolation regions. The self-aligned BPRs are formed in a grid shaped arrangement that allows forming semiconductor structures with hybrid or mixed cell heights.

An embodiment by which the semiconductor structure having backside interconnect structures can be formed is described in detail below by referring to the accompanying drawings in FIGS. 1-18C.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X', line Y1-Y1' and line Y2-Y2'. As depicted in the figure, line X-X' represents a cut along a nanosheet fin structure or nanosheet fin region 20 of the semiconductor structure 100, line Y1-Y1' represents a cut across source/drain regions in NFET regions 12 and PFET regions 16 of a first cell height area 30A of the semiconductor structure 100, and line Y2-Y2' represents a cut across source/drain regions in NFET regions 12 and PFET regions 16 of a second cell height area 30B of the semiconductor structure 100. According to an embodiment, a cell height of first cell height area 30A is less than a cell height of second cell height area 30B.

In one or more embodiments, cross-sectional views taken along lines Y1-Y1' and Y2-Y2' may further include a view of NFET regions 12 and/or PFET regions 16 and an N2P space (i.e., N-P boundary) 14 located between NFET and PFET regions 12, 16.

FIGS. 2A-2C, cross-sectional views of the semiconductor structure 100 are shown after forming a nanosheet stack 10, according to an embodiment of the present disclosure. In this embodiment, FIG. 2A is a cross-sectional view of the semiconductor structure 100 taken along line Y1-Y1', as depicted in FIG. 1; FIG. 2B is a cross-sectional view of the semiconductor structure 100 taken along line Y2-Y2', as depicted in FIG. 1; and FIG. 2C is a cross-sectional view of the semiconductor structure 100 taken along line X-X', as depicted in FIG. 1.

In the depicted example, the semiconductor structure 100 includes a substrate 102, a first sacrificial layer 104 located above the substrate 102, and a first semiconductor layer 106 disposed above the first sacrificial layer 104. According to an embodiment, the first sacrificial layer 104 and the first semiconductor layer 106 are vertically stacked one on top of another in a direction perpendicular to the substrate 102, as illustrated in the figure.

The substrate 102 may be, for example, a bulk substrate, which may be made from any of several known semiconductor materials such as, for example, silicon, germanium, silicon-germanium alloy, and compound (e.g., III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIGS. 2A-2C, according to an embodiment, the first sacrificial layer 104, can be formed on the substrate 102 using an epitaxial growth process. For instance, in the described embodiment, the first sacrificial layer 104 is formed by epitaxially growing a layer of SiGe with a germanium concentration varying from approximately 15 atomic percent to approximately 35 atomic percent. In a preferred embodiment, the first sacrificial layer 104 is made of epitaxially grown SiGe with a germanium concentration of approximately 30 atomic percent. Although, in some embodiments, the first sacrificial layer 104 may be made of silicon dioxide ($SiO_2$). In such embodiments, the combined structure formed by the substrate 102, the first sacrificial layer 104, and the first semiconductor layer 106 can be an SOI wafer, with the first sacrificial layer 104 being the buried oxide (BOX) including a thickness ranging from approximately 20 nm to approximately 100 nm, and ranges therebetween. In one or more embodiments, the first sacrificial layer 104 may act as an etch stop layer during subsequent substrate removal.

Similarly, the first semiconductor layer 106 is formed by epitaxially growing a Si layer to a thickness varying from approximately 30 nm to approximately 150 nm, although other thicknesses are within the contemplated scope of the invention.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically result in faster deposition, the faster deposition may result in crystal defects and film cracking.

Several different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

In the depicted embodiment, an alternating sequence of layers of sacrificial semiconductor material and layers of semiconductor channel material vertically stacked one on top of another in a direction perpendicular to the substrate 102 forms the nanosheet stack 10, as illustrated in the figure. Specifically, the alternating sequence includes a nanosheet stack sacrificial layer 108 above the first semiconductor layer 106, a second sacrificial semiconductor layer 110 above the nanosheet stack sacrificial layer 108, and a semiconductor channel layer 112 above the second sacrificial semiconductor layer 110. In the example depicted in the figure, alternating second sacrificial semiconductor layers 110 and semiconductor channel layers 112 are formed in a (nanosheet) stack 10 above the nanosheet stack sacrificial layer 108. The term sacrificial, as used herein, means a layer or other structure, which is (or a part thereof is) removed before completion of the final device.

For instance, in the example being described, portions of the second sacrificial semiconductor layers 110 will be removed from the stack in the channel region of the device to permit the semiconductor channel layers 112 to be released from the nanosheet stack 10. It is notable that while in the present example the second sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

With continued reference to FIGS. 2A-2C, a first (sacrificial) layer in the stack, i.e., the nanosheet stack sacrificial layer 108, is formed on the first semiconductor layer 106 using an epitaxial growth process. For instance, in the described embodiment, the nanosheet stack sacrificial layer 108 is formed by epitaxially growing a layer of SiGe with a higher germanium concentration varying between approximately 45 atomic percent to approximately 70 atomic percent. In a preferred embodiment, the nanosheet stack sacrificial layer 108 includes a layer of SiGe with a germanium concentration of approximately 55 atomic percent. The higher concentration of germanium atoms allows the nanosheet stack sacrificial layer 108 to be removed selectively to the remaining alternating layers of the nanosheet stack 10, as will be described in detail below. By way of example only, the nanosheet stack sacrificial layer 108 may be formed having a thickness varying from approximately 5 nm to approximately 20 nm, although thicknesses greater than 20 nm and less than 5 nm may also be used.

In general, layers in the nanosheet stack 10 (e.g., SiGe and Si layers) can be formed by epitaxial growth by using the first semiconductor layer 106 as the seed layer. For instance, the second sacrificial semiconductor layers 110 are formed by epitaxially growing a layer of SiGe. In this embodiment, the germanium concentration of the second sacrificial semiconductor layers 110 may vary from approximately 15 atomic percent to approximately 35 atomic percent. In a preferred embodiment, each of the second sacrificial semiconductor layers 110 includes a layer of SiGe with a germanium concentration of approximately 30 atomic percent.

To continue building the nanosheet stack 10, the semiconductor channel layers 112 are formed by epitaxially growing a Si layer. As depicted in the figure, the second sacrificial semiconductor layers 110 and the semiconductor channel layers 112 have a substantially similar or identical thickness. The nanosheet stack 10 is grown by forming (SiGe) sacrificial semiconductor layers 110 and (Si) semiconductor channel layers 112 in an alternating manner onto the nanosheet stack sacrificial layer 108. Accordingly, each of the second sacrificial semiconductor layers 110 and the semiconductor channel layers 112 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 112 in the nanosheet stack 10 will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

Figure 3B:
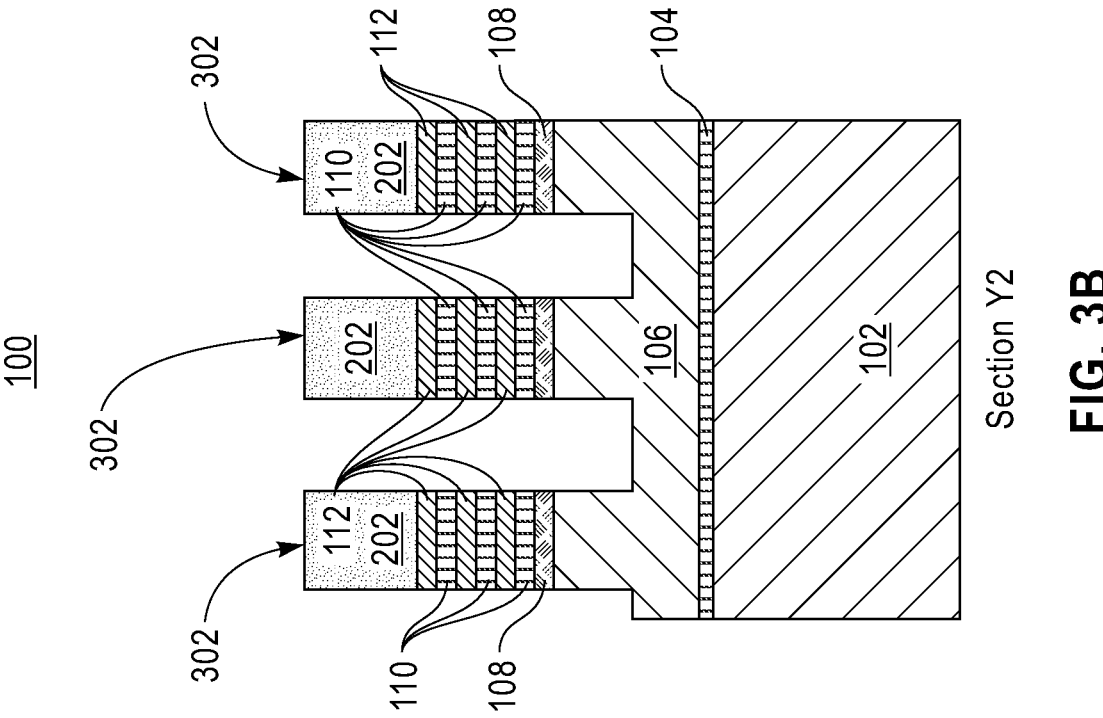
FIG. 3B is a cross-sectional view of the semiconductor structure taken along line Y2-Y2', as depicted in FIG. 1, according to an embodiment of the present disclosure.
Figure 3A:
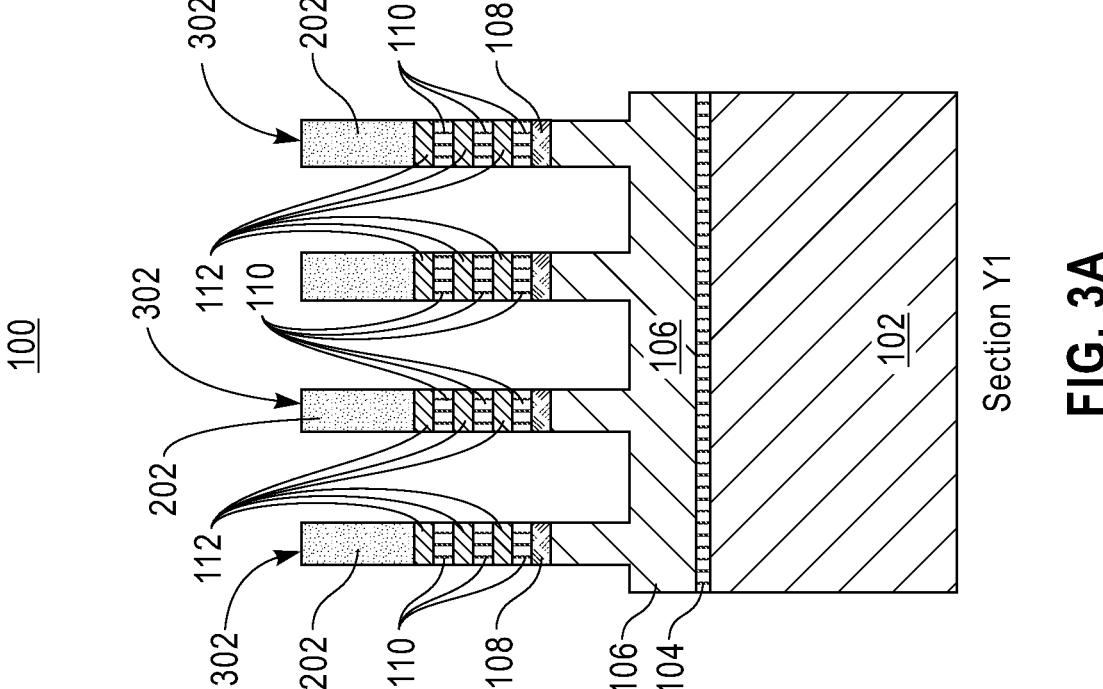
FIG. 3A is a cross-sectional view of the semiconductor structure taken along line Y1-Y1', as depicted in FIG. 1, depicting patterning the nanosheet stack to form a plurality of nanosheet fins, according to an embodiment of the present disclosure.
Figure 3C:
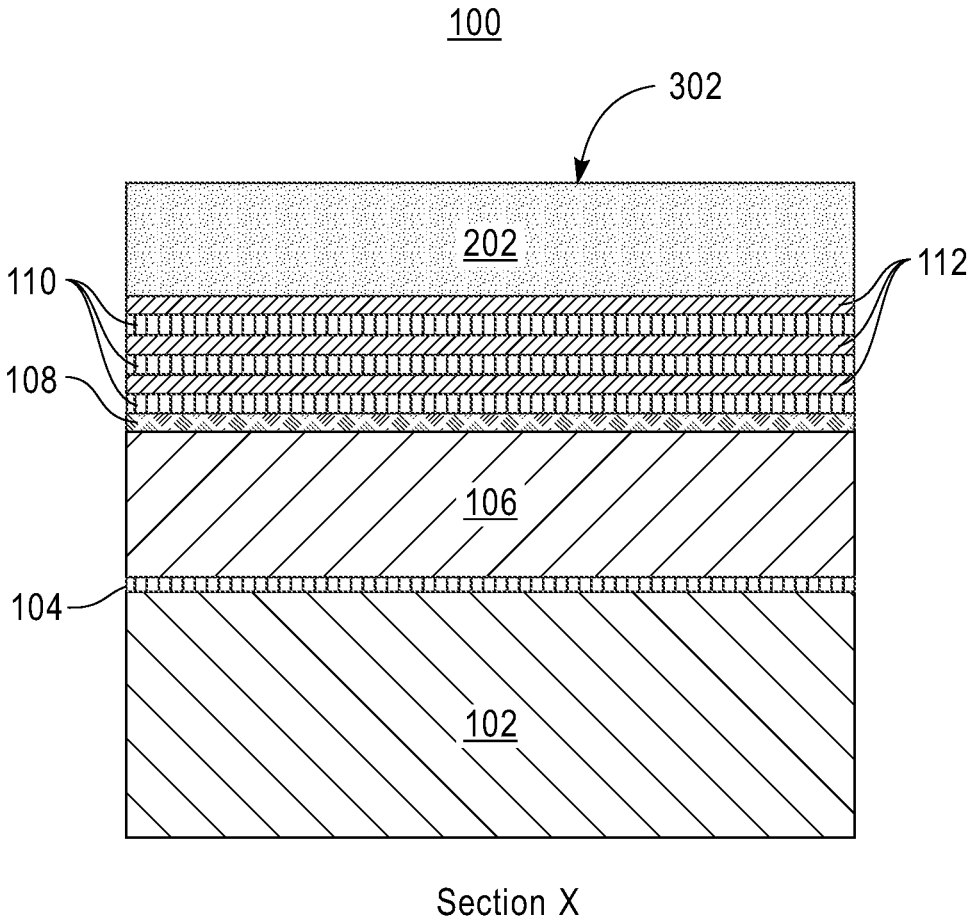
FIG. 3C is a cross-sectional view of the semiconductor structure taken along line X-X', as depicted in FIG. 1, according to an embodiment of the present disclosure.

FIGS. 3A-3C, cross-sectional views of the semiconductor structure 100 are shown after patterning the nanosheet stack 10 to form a plurality of nanosheet fins (hereinafter "nanosheet fins"), according to an embodiment of the present disclosure. In this embodiment, FIG. 3A is a cross-sectional view of the semiconductor structure 100 taken along line Y1-Y1', as depicted in FIG. 1; FIG. 3B is a cross-sectional view of the semiconductor structure 100 taken along line Y2-Y2', as depicted in FIG. 1; and FIG. 3C is a cross-sectional view of the semiconductor structure 100 taken along line X-X', as depicted in FIG. 1.

In the depicted embodiment, a hardmask layer 202 is formed over the nanosheet stack 10 shown in FIGS. 2A-2C by depositing a hard mask material (e.g., silicon nitride) using, for example, chemical vapor deposition (CVD), plasma enhanced CVD (PECVD) or any suitable technique for dielectric deposition. By way of example only, the hardmask layer 202 may be formed having a thickness varying from approximately 20 nm to approximately 200 nm, although thicknesses greater than 200 nm and less than 20 nm may also be used.

After depositing the hardmask layer 202, a photolithographic patterning is then conducted on the deposited hardmask layer 202 to form a plurality of individual fin hardmasks. According to an exemplary embodiment, reactive ion etching (RIE) can be used to etch through the nanosheet stack 10 (FIGS. 2A-2C) to form nanosheet fins 302. The etching process may continue until upper portions of the first semiconductor layer 106 located between adjacent nanosheet fins 302 are removed forming a plurality of trenches (not shown). The plurality of trenches (not shown) formed during the photolithographic patterning process can be subsequently filled with one or more insulating materials to form shallow trench isolation (STI) regions as will be described in detail below. It should be noted that nanosheet fins 302 depicted in FIG. 3A correspond to the first cell height area 30A of the semiconductor structure 100 shown in FIG. 1, while nanosheet fins 302 depicted in FIG. 3B correspond to second cell height area 30B depicted in FIG. 1.

Figure 4B:
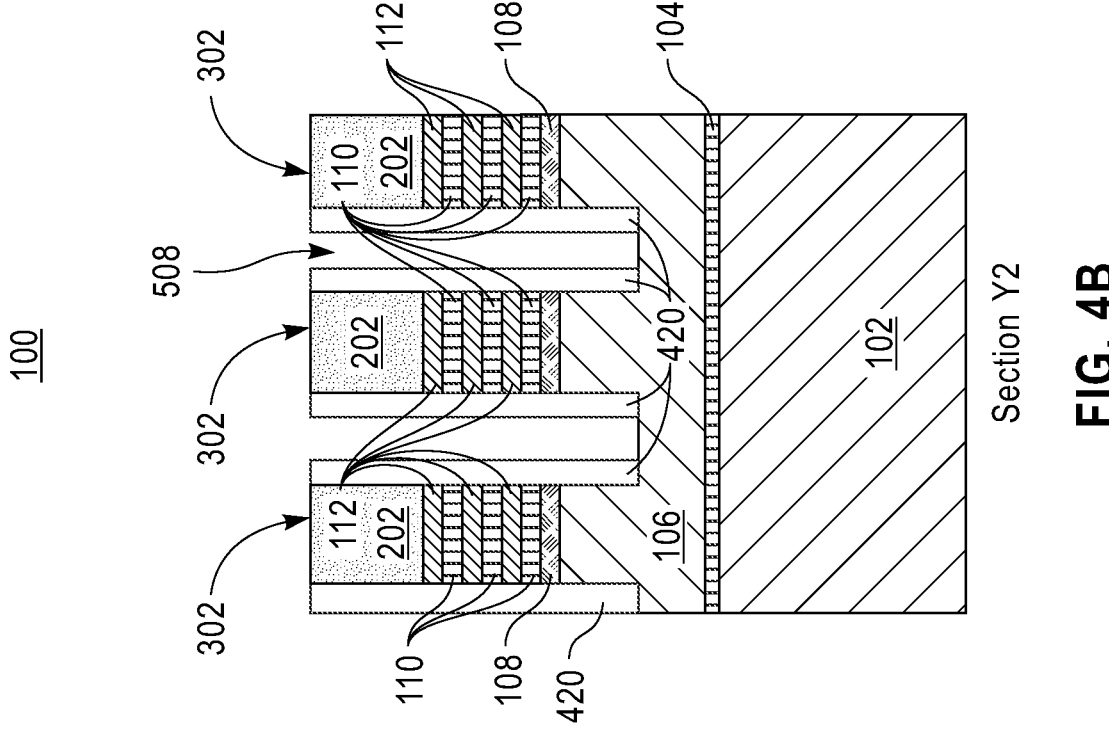
FIG. 4B is a cross-sectional view of the semiconductor structure taken along line Y2-Y2', as depicted in FIG. 1, according to an embodiment of the present disclosure.
Figure 4A:
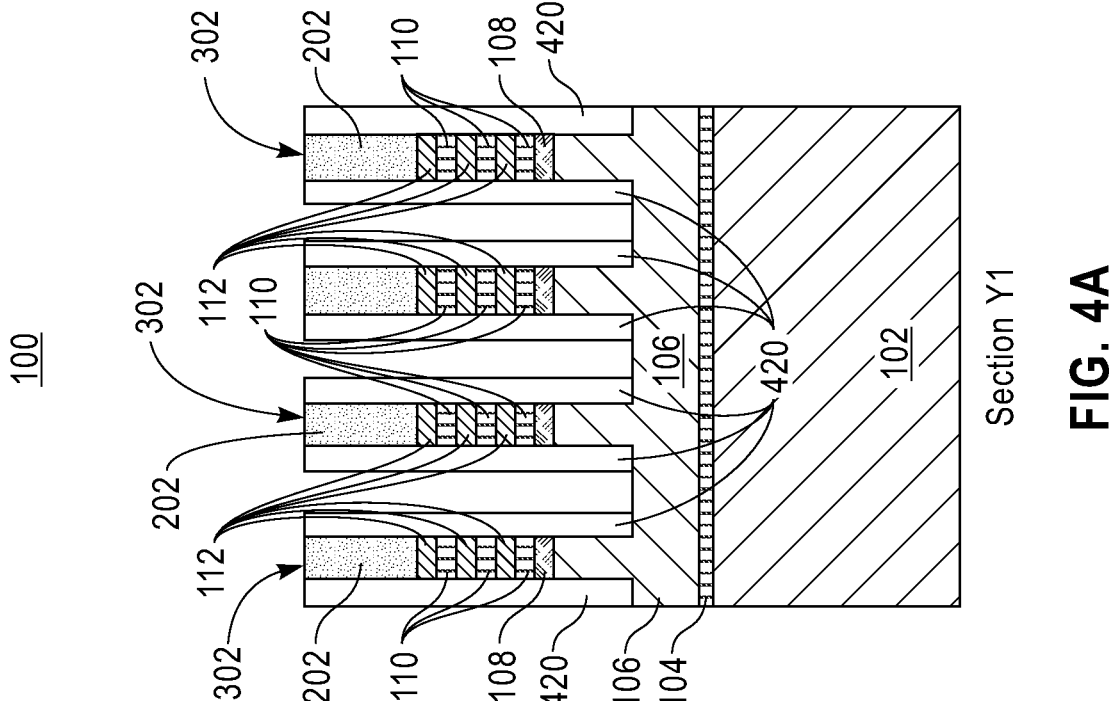
FIG. 4A is a cross-sectional view of the semiconductor structure taken along line Y1-Y1', as depicted in FIG. 1, depicting depositing a sacrificial liner between nanosheet fins, according to an embodiment of the present disclosure.
Figure 4C:
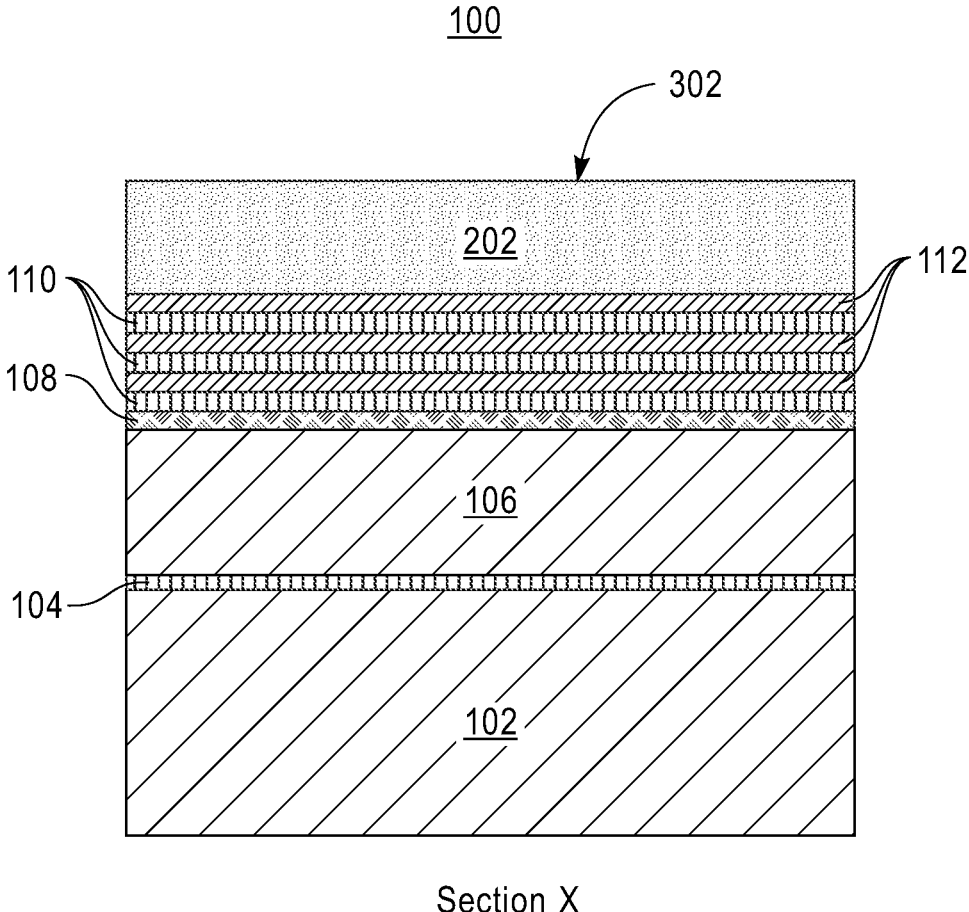
FIG. 4C is a cross-sectional view of the semiconductor structure taken along line X-X', as depicted in FIG. 1, according to an embodiment of the present disclosure.

Referring now to FIGS. 4A-4C, cross-sectional views of the semiconductor structure 100 are shown after depositing a sacrificial liner 420 between nanosheet fins 302, according to an embodiment of the present disclosure. In this embodiment, FIG. 4A is a cross-sectional view of the semiconductor structure 100 taken along line Y1-Y1', as depicted in FIG. 1; FIG. 4B is a cross-sectional view of the semiconductor structure 100 taken along line Y2-Y2', as depicted in FIG. 1; and FIG. 4C is a cross-sectional view of the semiconductor structure 100 taken along line X-X', as depicted in FIG. 1.

In the depicted embodiment, a sacrificial liner 420 is formed along opposite sidewalls of each nanosheet fin 302. The sacrificial liner 420 reduces a space between adjacent nanosheet fins 302 (i.e., fin-to-fin spacing). The sacrificial liner 420 may include a layer of $SiO_2$, AlOx, TiOx, TiN or similar materials placed on the semiconductor structure 100 using any suitable deposition method. For example, the sacrificial liner 420 may be formed using a conformal deposition process followed by anisotropic RIE. In an exemplary embodiment, the sacrificial liner 420 may have a thickness varying from approximately 3 nm to approximately 15 nm, and ranges therebetween. In the depicted embodiment, a portion of an uppermost surface of the first semiconductor layer 106 not covered by the sacrificial liner 420 remains exposed after deposition of the sacrificial liner 420, as shown in FIGS. 4A-4B.

Figure 5B:
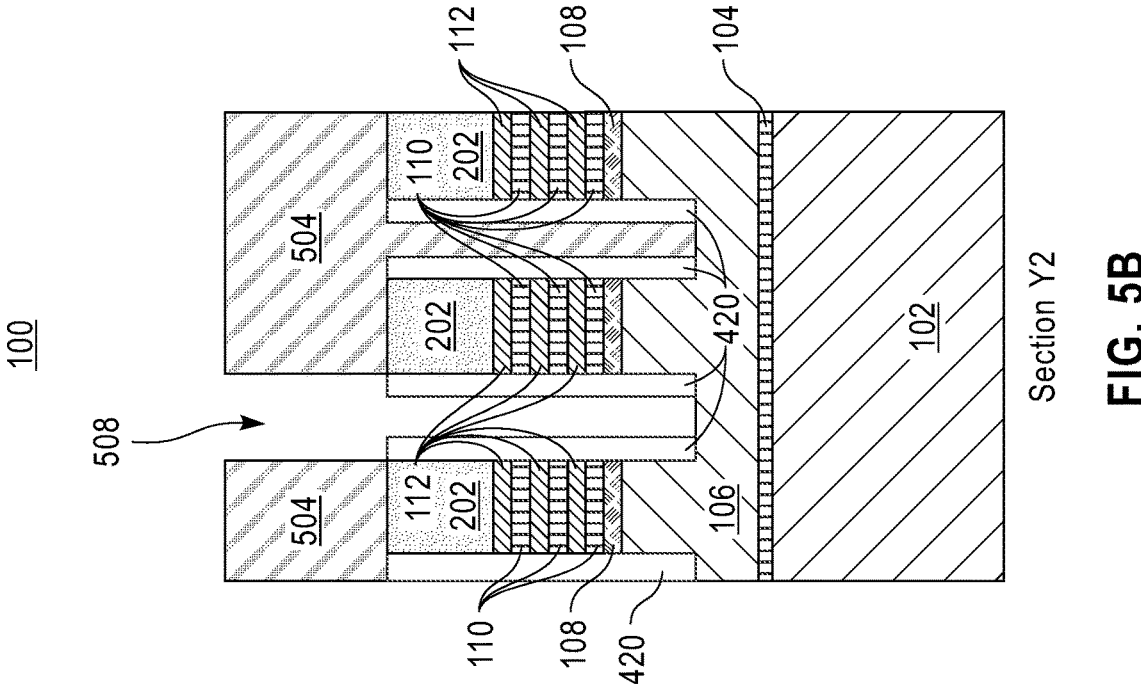
FIG. 5B is a cross-sectional view of the semiconductor structure taken along line Y2-Y2', as depicted in FIG. 1, according to an embodiment of the present disclosure.
Figure 5A:
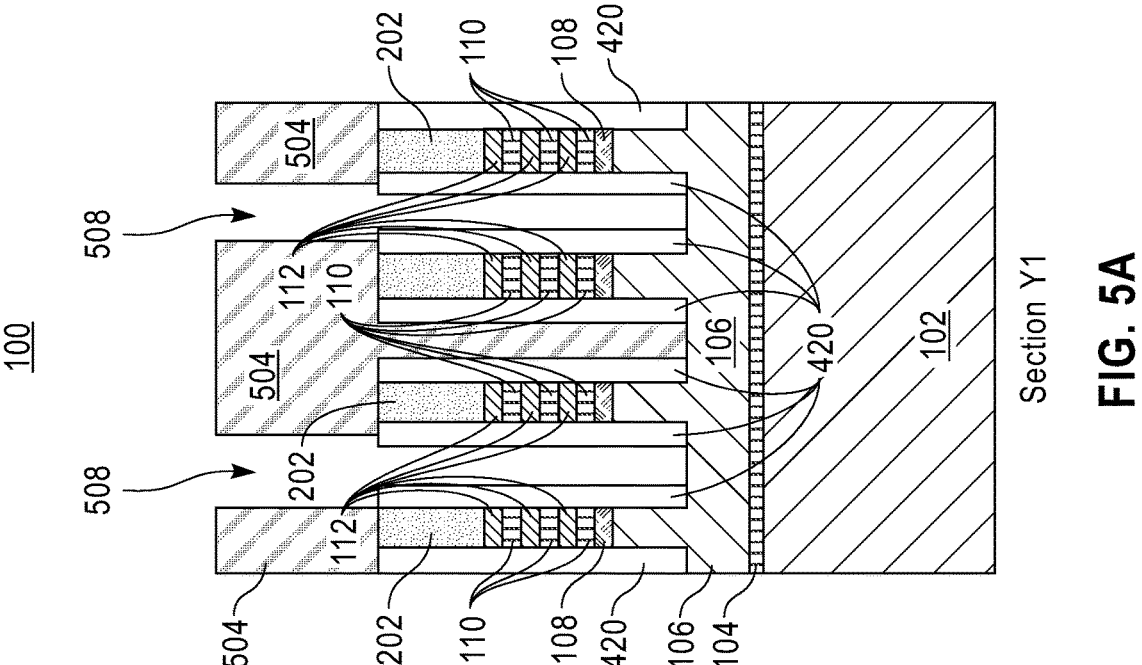
FIG. 5A is a cross-sectional view of the semiconductor structure taken along line Y1-Y1', as depicted in FIG. 1, after lithography opening of N2P spaces, according to an embodiment of the present disclosure.
Figure 5C:
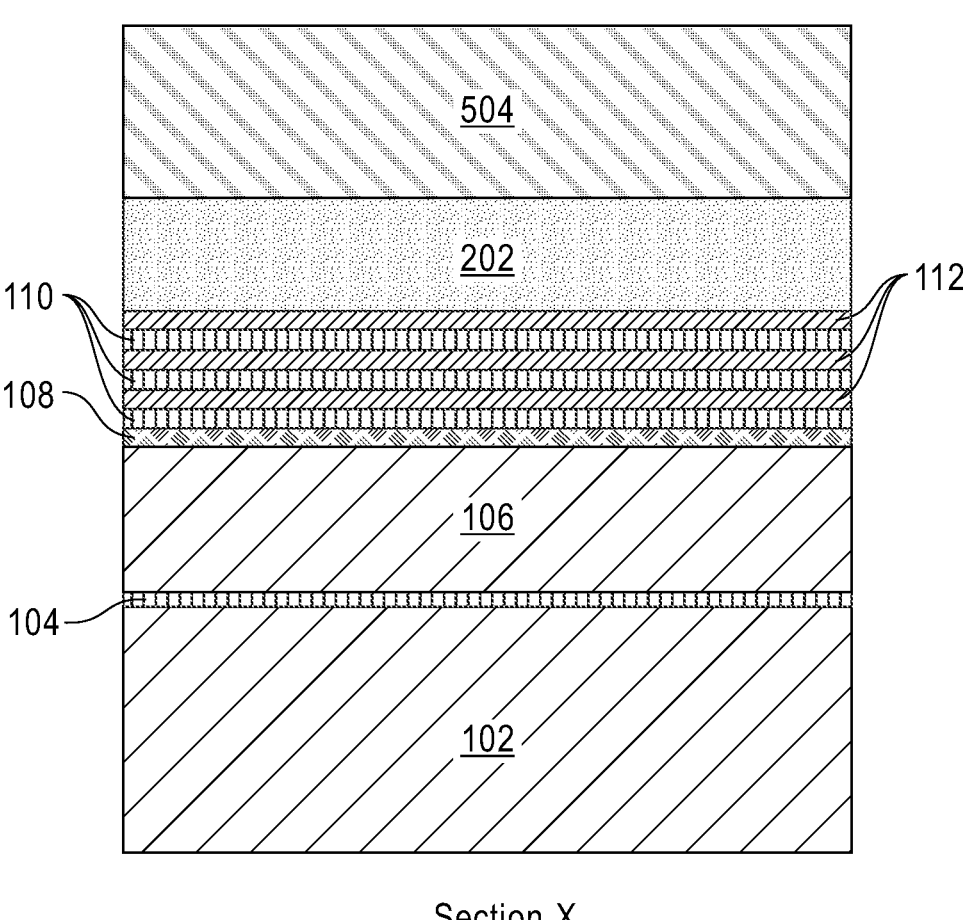
FIG. 5C is a cross-sectional view of the semiconductor structure taken along line X-X', as depicted in FIG. 1, according to an embodiment of the present disclosure.

Referring now to FIGS. 5A-5C, cross-sectional views of the semiconductor structure 100 are shown after lithography opening of N2P spaces, according to an embodiment of the present disclosure. In this embodiment, FIG. 5A is a cross-sectional view of the semiconductor structure 100 taken along line Y1-Y1', as depicted in FIG. 1; FIG. 5B is a cross-sectional view of the semiconductor structure 100 taken along line Y2-Y2', as depicted in FIG. 1; and FIG. 5C is a cross-sectional view of the semiconductor structure 100 taken along line X-X', as depicted in FIG. 1.

According to an embodiment, an organic planarization layer (OPL), or simply planarization layer 504 can be deposited on the semiconductor structure 100. The planarization layer 504 can be made of any organic planarizing material that is capable of effectively preventing damage of underlying layers during subsequent etching processes. The planarization layer 504 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the planarization layer 504 may include JSR HM8006, JSR HM8014, AZ UM10M2, Shin Etsu ODL 102, or other similar commercially available materials. The planarization layer 504 may be deposited by, for example, spin coating.

With continued reference to FIGS. 5A-5C, a lithography process followed by an etching process is conducted on the semiconductor structure 100 to remove portions of the planarization layer 504 from areas of the semiconductor structure 100 corresponding to N2P spaces 14 depicted in FIG. 1. As mentioned above with reference to FIG. 1, N2P spaces 14 are located between NFET and PFET regions 12, 16 of the semiconductor structure 100. Accordingly, the planarization layer 504 is removed only from an area between nanosheet fins 302 corresponding to an N2P space 14. As shown in FIGS. 5A-5C, portions of the planarization layer 504 remain between adjacent nanosheet fins 302 located within same polarity regions, i.e., NFET or PFET regions 12, 16 as depicted in FIG. 1. First openings 508 remain in the semiconductor structure 100 after removing the planarization layer 504 from N2P spaces 14. The first openings 508 expose the uppermost surface of the first semiconductor layer 106 not covered by the sacrificial liner 420 and located within an N2P space 14 (FIG. 1). In some embodiments, etching the planarization layer 504 can be conducted by, for example, an OPL RIE including a trace point detection.

Figure 6A:
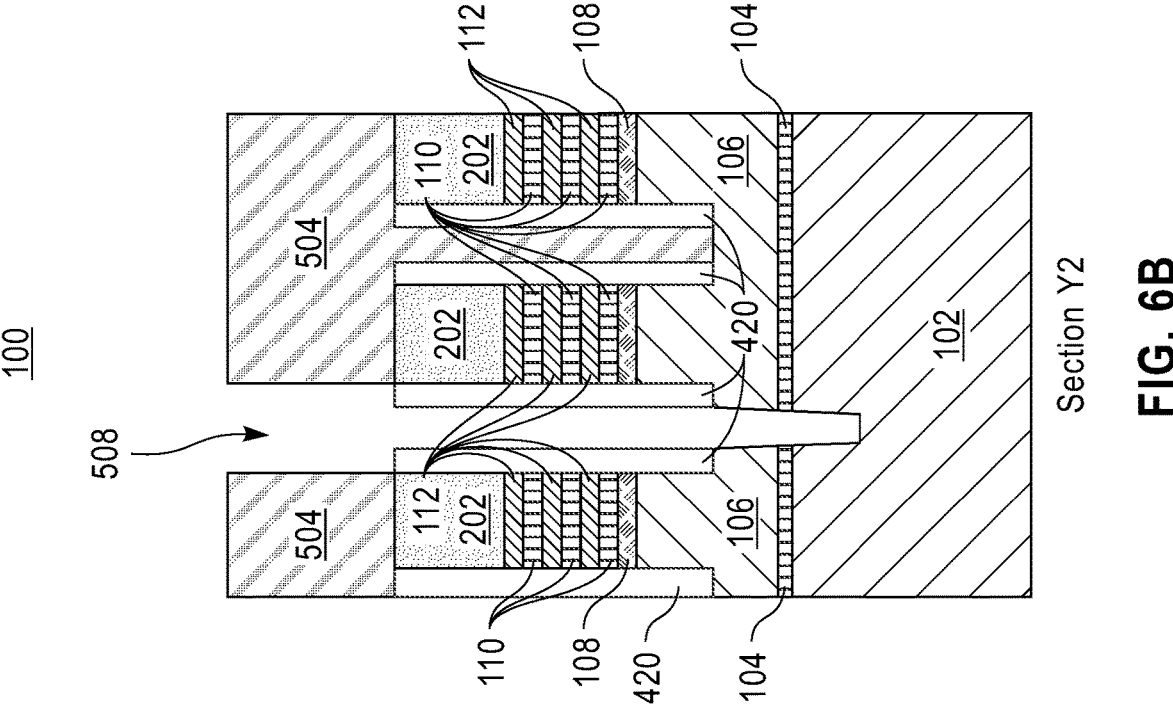
FIG. 6A is a cross-sectional view of the semiconductor structure taken along line Y1-Y1', as depicted in FIG. 1, after conducting an etching process to extend first openings and form a backside trench, according to an embodiment of the present disclosure.
Figure 6B:
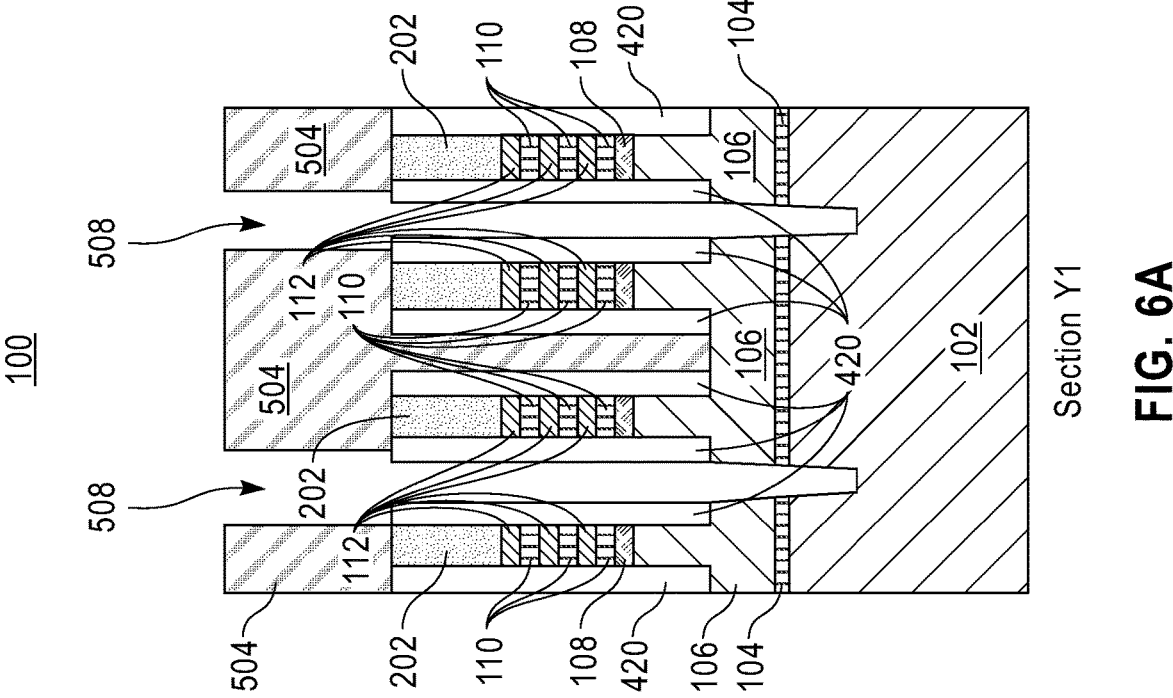
FIG. 6B is a cross-sectional view of the semiconductor structure taken along line Y2-Y2', as depicted in FIG. 1, according to an embodiment of the present disclosure.
Figure 6C:
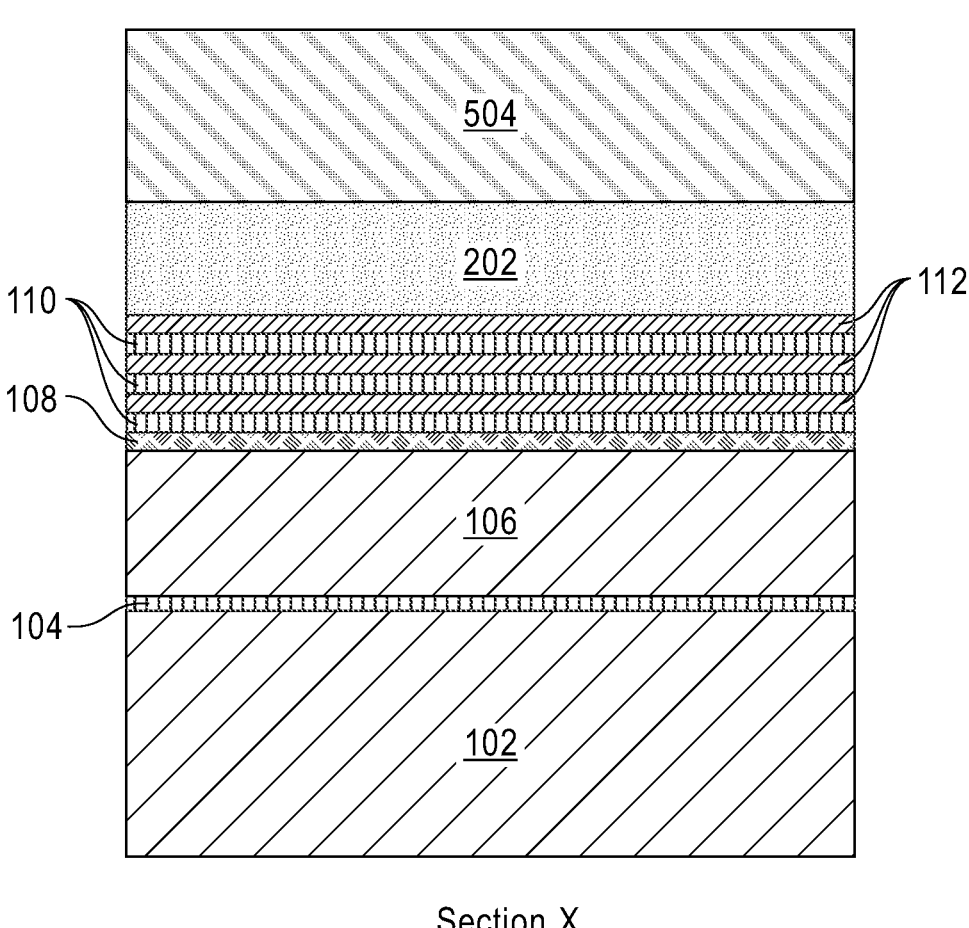
FIG. 6C is a cross-sectional view of the semiconductor structure taken along line X-X', as depicted in FIG. 1, according to an embodiment of the present disclosure.

Referring now to FIGS. 6A-6C, cross-sectional views of the semiconductor structure 100 are shown after conducting an etching process to extend first openings 508 and form a backside trench, according to an embodiment of the present disclosure. In this embodiment, FIG. 6A is a cross-sectional view of the semiconductor structure 100 taken along line Y1-Y1', as depicted in FIG. 1; FIG. 6B is a cross-sectional view of the semiconductor structure 100 taken along line Y2-Y2', as depicted in FIG. 1; and FIG. 6C is a cross-sectional view of the semiconductor structure 100 taken along line X-X', as depicted in FIG. 1.

In this embodiment, an etching process such as reactive ion etching (RIE) can be conducted on the semiconductor structure 100 to increase a size of the first openings 508. As depicted in FIGS. 6A-6B, after the etching process, the first openings 508 extend through the first semiconductor layer 106, first sacrificial layer 104 and a top portion of substrate 102 providing a backside trench region for the semiconductor structure 100. In one or more embodiments, the first openings 508 may have a (positive) tapered etch profile narrowing in a direction towards the substrate 102.

Figure 7B:
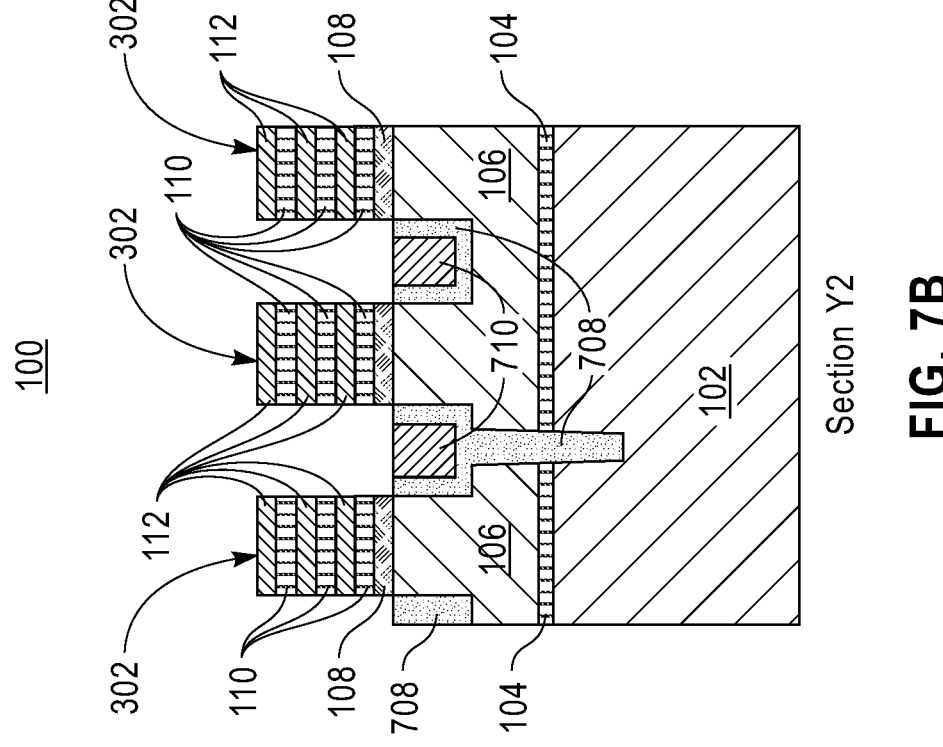
FIG. 7B is a cross-sectional view of the semiconductor structure taken along line Y2-Y2', as depicted in FIG. 1, according to an embodiment of the present disclosure.
Figure 7A:
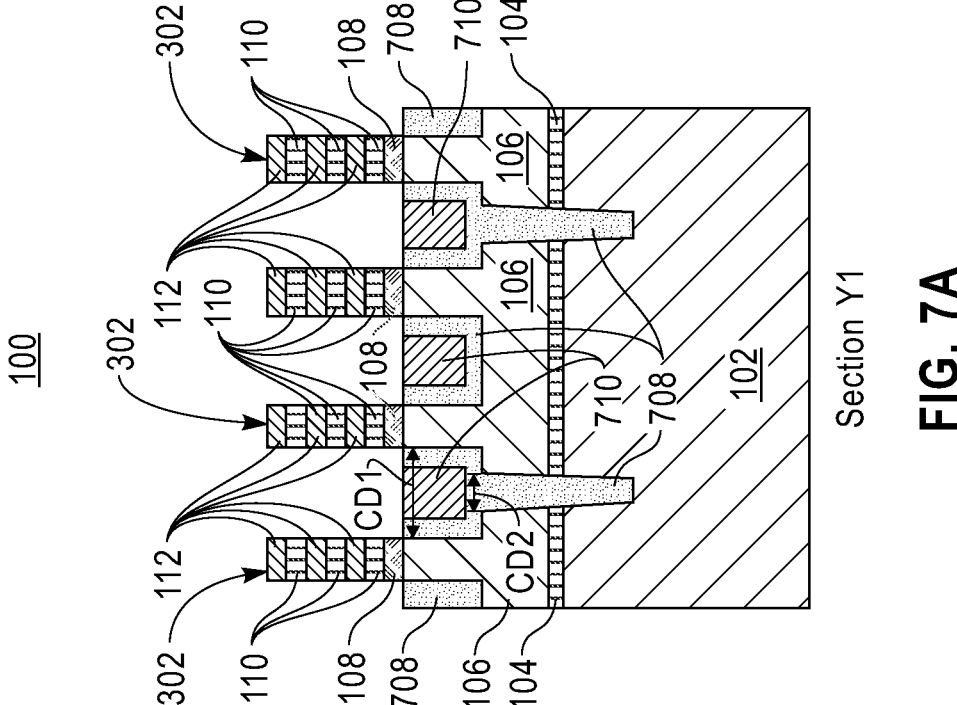
FIG. 7A is a cross-sectional view of the semiconductor structure taken along line Y1-Y1', as depicted in FIG. 1, after performing the steps of removing a planarization layer, removing a sacrificial liner, forming an STI liner within first openings, forming STI regions and removing a hardmask layer, according to an embodiment of the present disclosure.
Figure 7C:
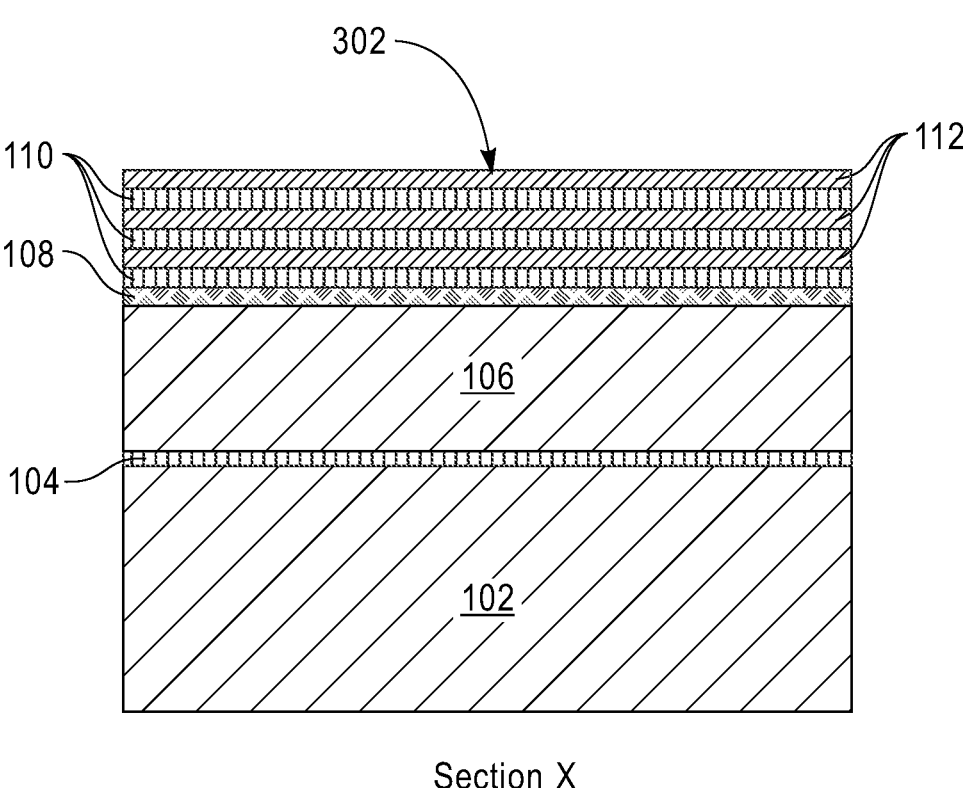
FIG. 7C is a cross-sectional view of the semiconductor structure taken along line X-X', as depicted in FIG. 1, according to an embodiment of the present disclosure.

Referring now to FIGS. 7A-7C, cross-sectional views of the semiconductor structure 100 are shown after performing the steps of removing the planarization layer 504, removing the sacrificial liner 420, forming an STI liner 708 within first openings 508, forming STI regions 710 and removing the hardmask layer 202 (FIGS. 6A-6C), according to an embodiment of the present disclosure. In this embodiment, FIG. 7A is a cross-sectional view of the semiconductor structure 100 taken along line Y1-Y1', as depicted in FIG. 1; FIG. 7B is a cross-sectional view of the semiconductor structure 100 taken along line Y2-Y2', as depicted in FIG. 1; and FIG. 7C is a cross-sectional view of the semiconductor structure 100 taken along line X-X', as depicted in FIG. 1.

The planarization layer 504 can be removed from the semiconductor structure 100 using suitable techniques including, but not limited to, oxygen plasma, nitrogen plasma, hydrogen plasma or other carbon strip or ashing process, which causes minimal or no damage to the underlying layers. Similarly, the sacrificial liner 420 can also be selectively removed from the semiconductor structure 100 using, for example, a SC1 wet clean process.

Removal of the planarization layer 504 and sacrificial liner 420 exposes or reveals the nanosheet fins 302. In one or more embodiments, an STI liner 708 can be conformally deposited within the first openings 508 (FIGS. 6A-6B). The STI liner 708 can be formed, for example, by conformal deposition (e.g., CVD) of a first dielectric material, such as silicon nitride (SiN), that pinches off the narrower bottom portion of the first opening 508 (FIGS. 6A-6B) extending towards the substrate 102. It should be noted that after removing the sacrificial liner 420, the first openings 508 (FIGS. 6A-6B) may include a top portion having a first critical dimension (CD1) and a bottom portion having a second critical dimension (CD2). After depositing the STI liner 708, due to the CD2 being smaller than the CD1, the STI liner 708 substantially fills the bottom portion of the first openings 508 (FIGS. 6A-6B). A remaining space within the top (wider) portion of the first openings 508 (FIGS. 6A-6B) can be filled with a second dielectric material to form STI regions 710 in the semiconductor structure 100 for electrically isolating the nanosheet fins 302.

The second dielectric material may be formed, for example, by CVD of a dielectric material including, but not limited to, silicon oxide, silicon nitride, hydrogenated silicon carbon oxide, silicon based low-k dielectrics, flowable oxides, porous dielectrics, or organic dielectrics including porous organic dielectrics. In some embodiments, the critical dimension (CD2) of the bottom portion of the first openings 508 (FIGS. 6A-6B) may have a larger size that allows the second dielectric material forming the STI regions 710 to deposit within the bottom portion of the first openings 508 (FIGS. 6A-6B). After forming the STI regions 710, the hardmask layer 202 (FIGS. 6A-6C) can be removed from the semiconductor structure 100 using any suitable etching technique.

Figure 8B:
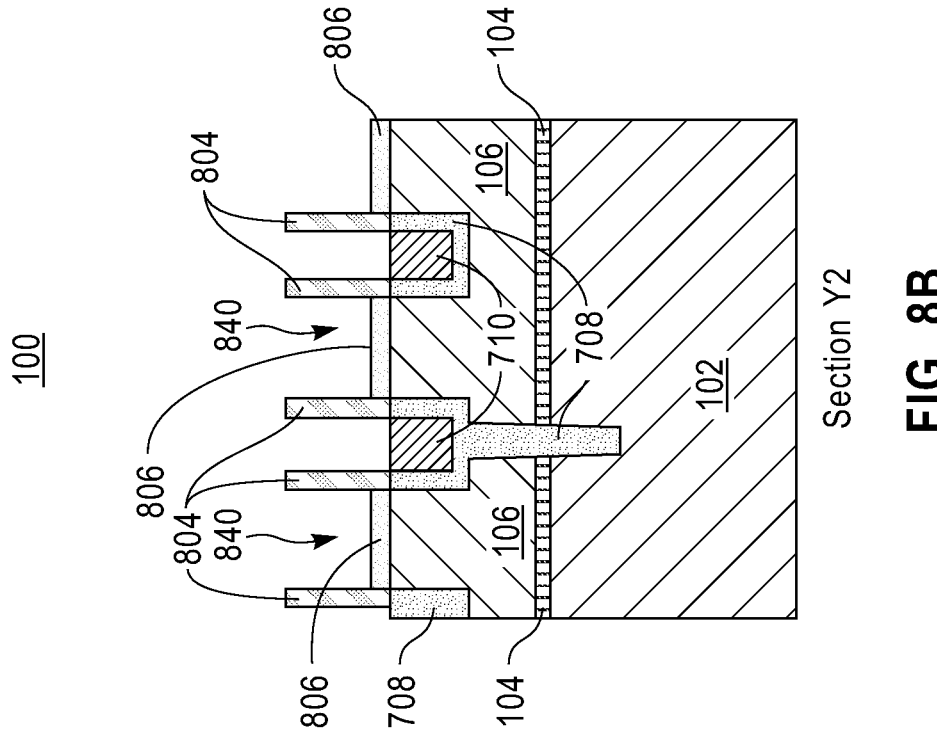
FIG. 8B is a cross-sectional view of the semiconductor structure taken along line Y2-Y2', as depicted in FIG. 1, according to an embodiment of the present disclosure.
Figure 8A:
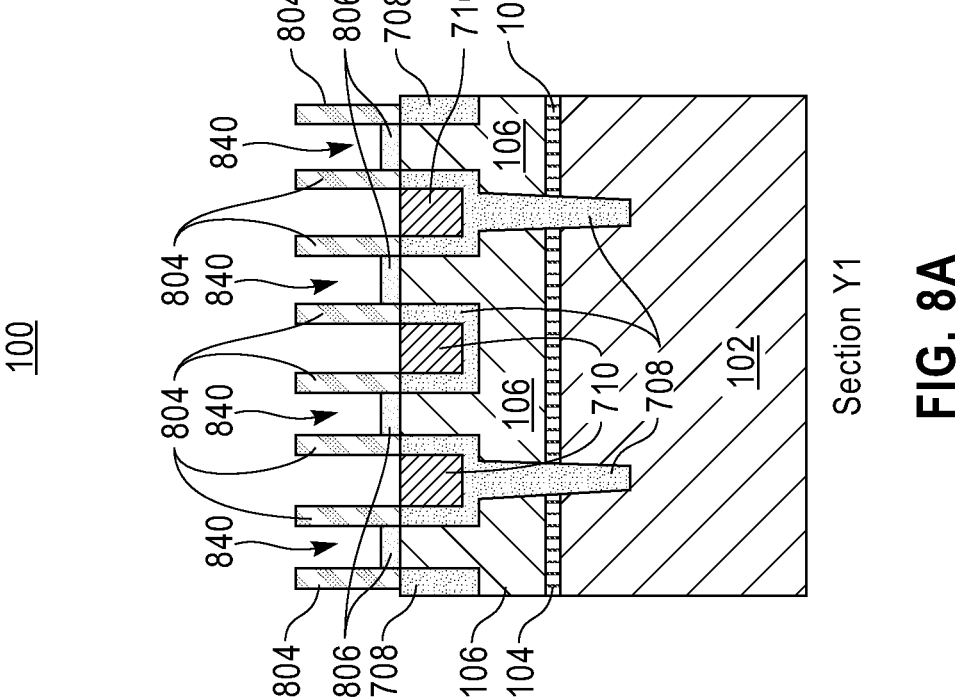
FIG. 8A is a cross-sectional view of the semiconductor structure taken along line Y1-Y1', as depicted in FIG. 1, after forming a dummy gate, forming a sacrificial hardmask above the dummy gate, removing a nanosheet stack sacrificial layer, forming a sidewall spacer and bottom dielectric isolation, recessing nanosheet fins, and forming inner spacers, according to an embodiment of the present disclosure.
Figure 8C:
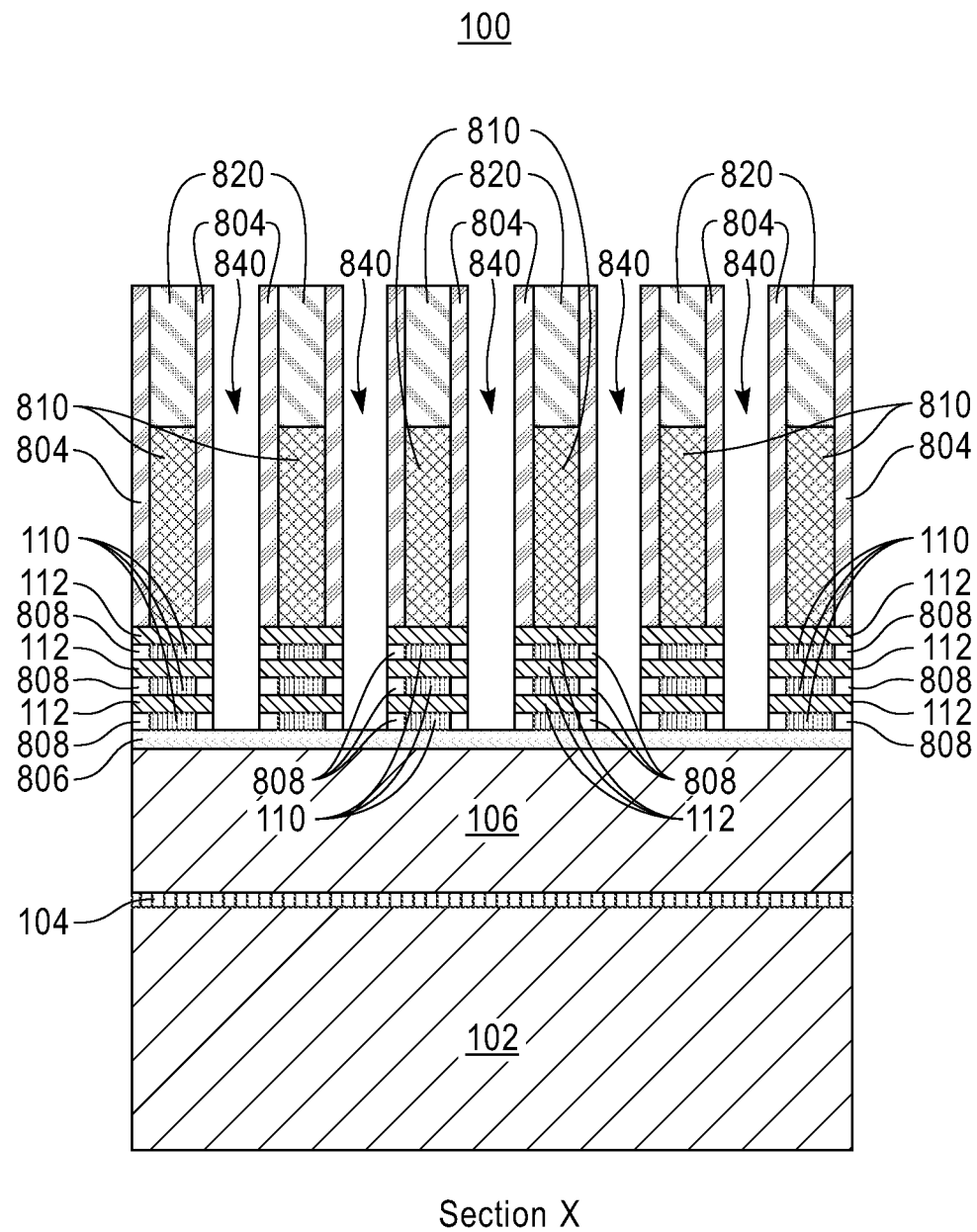
FIG. 8C is a cross-sectional view of the semiconductor structure 100 taken along line X-X', as depicted in FIG. 1, according to an embodiment of the present disclosure.

Referring now to FIGS. 8A-8C, cross-sectional views of the semiconductor structure 100 are shown after forming a dummy gate 810, forming a sacrificial hardmask 820 above the dummy gate 810, removing the nanosheet stack sacrificial layer 108, forming a sidewall spacer 804 and bottom dielectric isolation layer 806, recessing nanosheet fins 302, and forming inner spacers 808, according to an embodiment of the present disclosure. In this embodiment, FIG. 8A is a cross-sectional view of the semiconductor structure 100 taken along line Y1-Y1', as depicted in FIG. 1; FIG. 8B is a cross-sectional view of the semiconductor structure 100 taken along line Y2-Y2', as depicted in FIG. 1; and FIG. 8C is a cross-sectional view of the semiconductor structure 100 taken along line X-X', as depicted in FIG. 1.

In the depicted embodiment, the dummy gate 810 and sacrificial hardmask 820 form a sacrificial gate structure for the semiconductor structure 100. The process of forming the dummy gate 810 and sacrificial hardmask 820 is typical and well-known in the art. In one or more embodiments, the dummy gate 810 is formed from amorphous silicon (a-Si), and the sacrificial hardmask 820 is formed from silicon nitride (SiN), silicon oxide, an oxide/nitride stack, or similar materials and configurations.

After depositing the dummy gate 810 and sacrificial hardmask 820 on the semiconductor structure 100, the dummy gate 810 and sacrificial hardmask 820 are patterned as depicted in the figures. As known by those skilled in the art, the process of patterning the dummy gate 810 typically involves exposing a pattern on a photoresist layer (not shown) and transferring the pattern to the sacrificial hardmask 820 and dummy gate 810 using known lithography and RIE processing. The dummy gate 810 is formed and patterned over a topmost semiconductor channel layer 112. Although not depicted in the figures, the dummy gate 810 is also formed along sidewalls of the nanosheet fins 302.

The process continues by removing the nanosheet stack sacrificial layer 108 (FIGS. 7A-7C). According to an embodiment, the nanosheet stack sacrificial layer 108 is removed selective to the first semiconductor layer 106, the second sacrificial semiconductor layers 110, the semiconductor channel layers 112, the dummy gate 810 and the sacrificial hardmask 820. For example, a highly selective dry etch process can be used to selectively remove the nanosheet stack sacrificial layer 108 (FIGS. 7A-7C). Removing the nanosheet stack sacrificial layer 108 creates second openings (not shown) in the semiconductor structure 100.

Subsequently, a spacer material can be deposited on the semiconductor structure 100. The spacer material deposits along sidewalls of the dummy gate 810 and sacrificial hardmask 820 to form the sidewall spacer 804. The spacer material forming the sidewall spacer 804 substantially fills the second openings (not shown) formed after removing the nanosheet stack sacrificial layer 108 (FIGS. 7A-7C). The sidewall spacer 804 can be formed using a spacer pull down formation process. The sidewall spacer 804 can also be formed using a sidewall image transfer (SIT) spacer formation process, which includes spacer material deposition followed by directional RIE of the deposited spacer material. In one or more embodiments, the spacer material deposited between a bottom surface of the nanosheet fins 302 and the substrate 102 can be referred to as a bottom dielectric isolation layer 806. In some embodiments, the bottom dielectric isolation layer 806 and the sidewall spacer 804 may be composed of different materials.

Non-limiting examples of various spacer materials for forming the sidewall spacer 804 and the bottom dielectric isolation layer 806 may include conventional low-k materials such as $SiO_2$, SiOC, SiOCN, or SiBCN. Typically, a thickness of the sidewall spacer 804 may vary from approximately 5 nm to approximately 20 nm, and ranges therebetween.

As known by those skilled in the art, the sidewall spacer 804 can be used as a mask, to recess portions of the nanosheet fins 302 not covered by the sidewall spacer 804 and dummy gate 810. For example, a RIE process can be used to recess the portions of the nanosheet fins 302 that are not under the sidewall spacer 804 and dummy gate 810. According to an embodiment, the nanosheet fins 302 can be recessed until reaching a top portion of the bottom dielectric isolation layer 806. In one or more embodiments, recessing the nanosheet fins 302 form third openings (or source/drain recesses) 840 in the semiconductor structure 100.

With continued reference to FIGS. 8A-8C, outer portions of each of the second sacrificial semiconductor layers 110 are selectively recessed using, for example, a selective etch process such as a hydrogen chloride (HCL) gas etch. Preferably, the selected etch process for recessing the second sacrificial semiconductor layers 110 is capable of etching silicon germanium without attacking silicon. The inner spacers 808 may be formed within an indented cavity (not shown) formed after etching the second sacrificial semiconductor layers 110. The inner spacers 808 can be formed, for example, by conformal deposition of an inner spacer dielectric material that pinches off the indented cavity (not shown) formed after recessing the second sacrificial semiconductor layers 110. The inner spacers 808 may be formed using any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 8C, outer sidewalls of the inner spacers 808 are vertically aligned with the semiconductor channel layers 112, and thus with upper portions of the sidewall spacer 804 located on opposing sidewalls of the dummy gate 810.

Figure 9B:
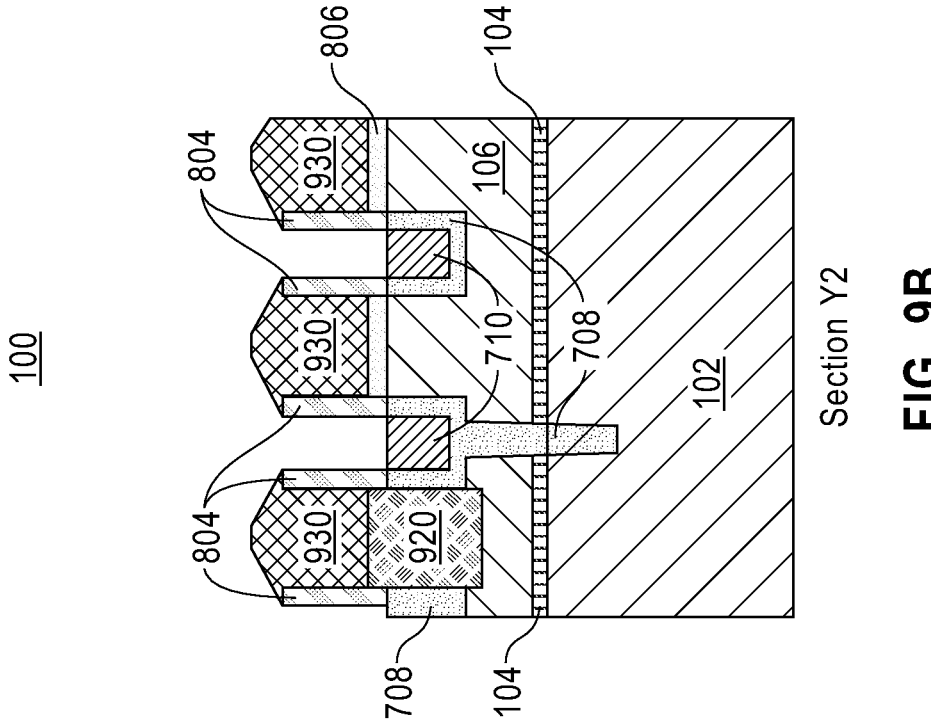
FIG. 9B is a cross-sectional view of the semiconductor structure taken along line Y2-Y2', as depicted in FIG. 1, according to an embodiment of the present disclosure.
Figure 9A:
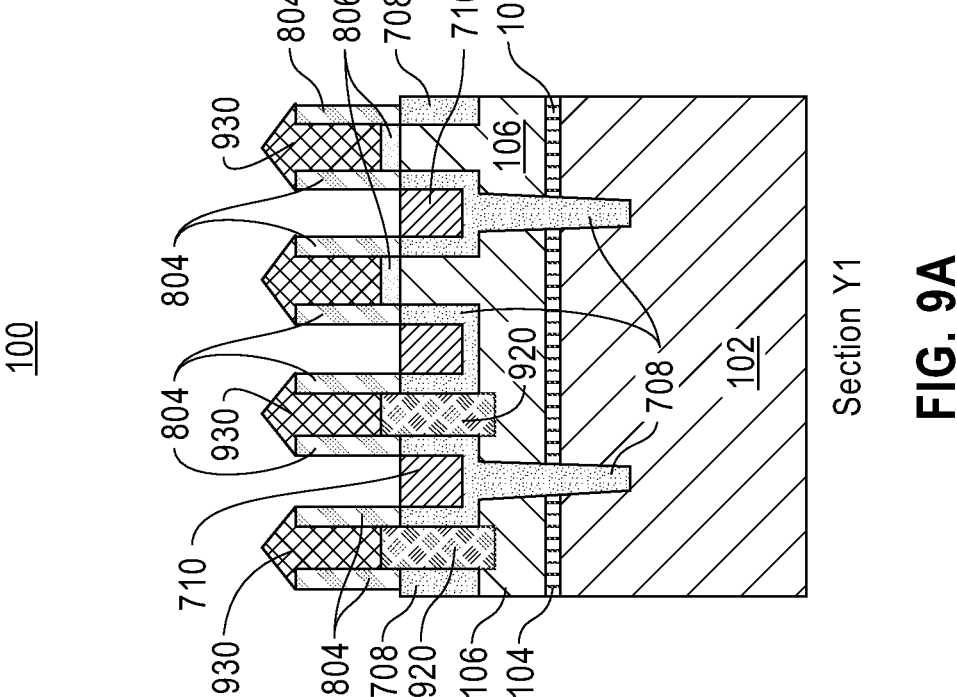
FIG. 9A is a cross-sectional view of the semiconductor structure taken along line Y1-Y1', as depicted in FIG. 1, after forming a sacrificial placeholder layer for backside contact formation and forming source/drain regions, according to an embodiment of the present disclosure.
Figure 9C:
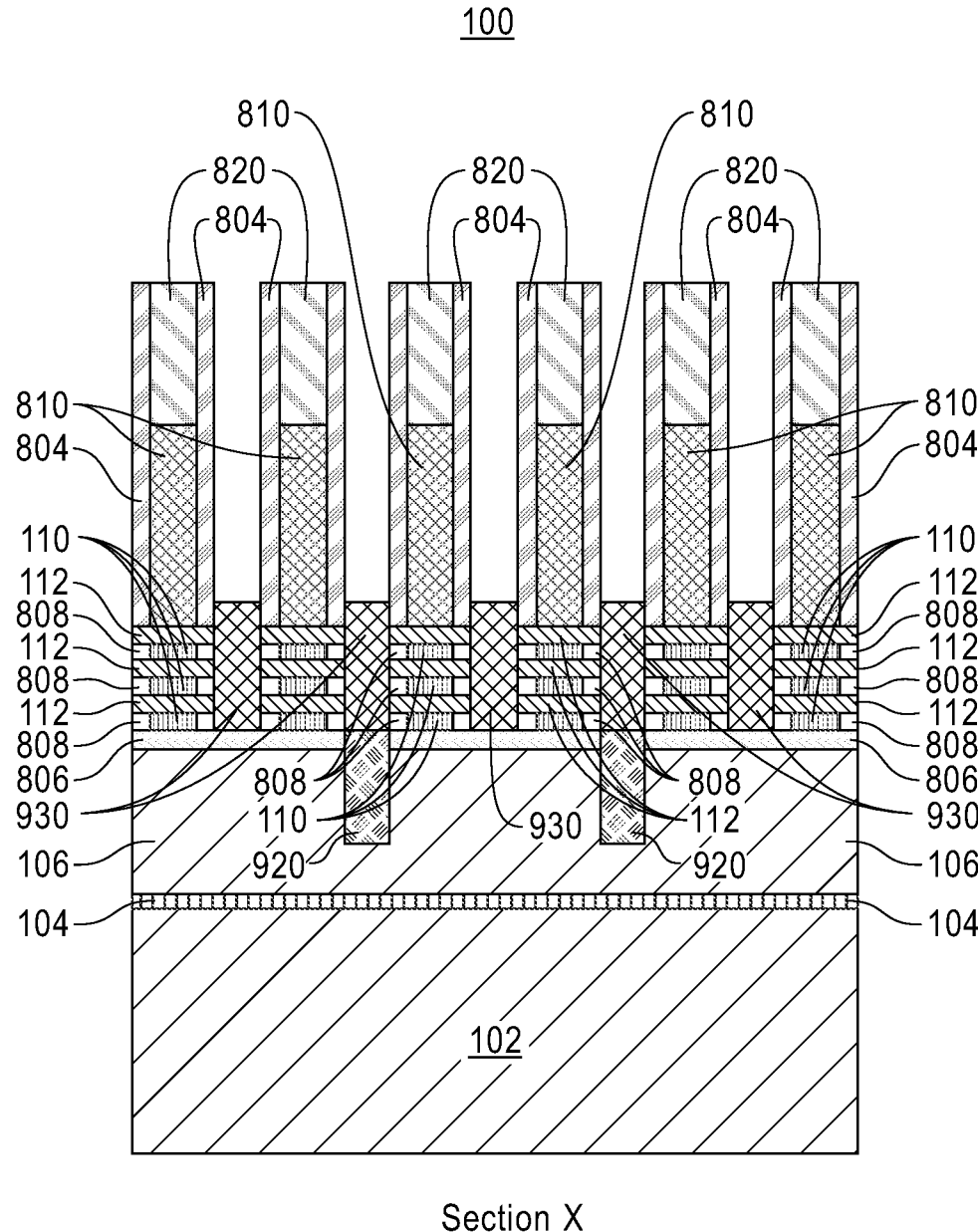
FIG. 9C is a cross-sectional view of the semiconductor structure taken along line X-X', as depicted in FIG. 1, according to an embodiment of the present disclosure.
Figure 9D:
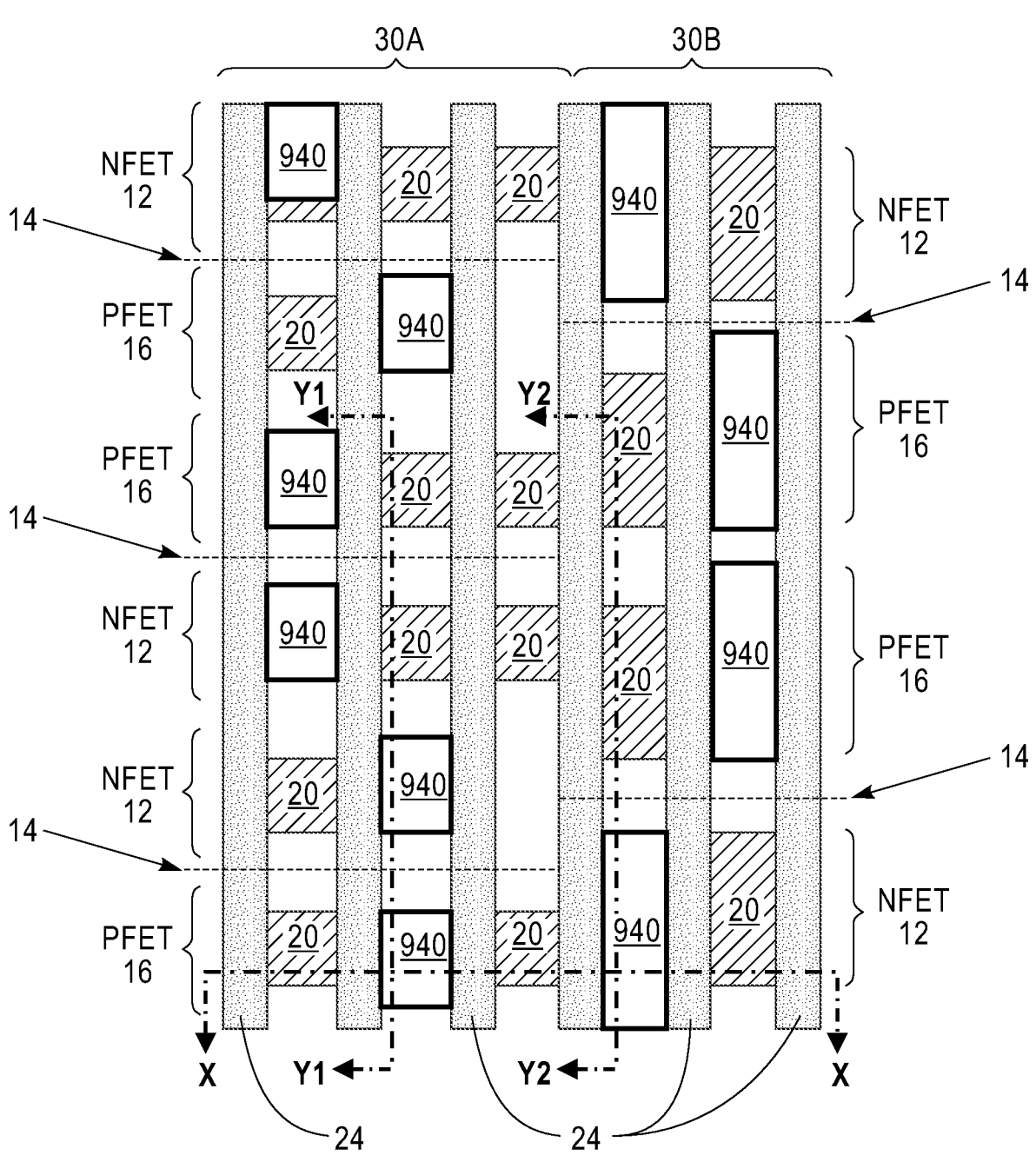
FIG. 9D is a top-down view of the semiconductor structure, according to an embodiment of the present disclosure.

Referring now to FIGS. 9A-9D, cross-sectional views of the semiconductor structure 100 are shown after forming a sacrificial placeholder layer 920 for backside contact formation and forming source/drain regions 930, according to an embodiment of the present disclosure. In this embodiment, FIG. 9A is a cross-sectional view of the semiconductor structure 100 taken along line Y1-Y1', as depicted in FIG. 1; FIG. 9B is a cross-sectional view of the semiconductor structure 100 taken along line Y2-Y2', as depicted in FIG. 1; FIG. 9C is a cross-sectional view of the semiconductor structure 100 taken along line X-X', as depicted in FIG. 1; and FIG. 9D is a top-down view of the semiconductor structure 100.

Although not depicted in the figures, it should be noted that prior to forming the placeholder layer 920, a lithography process followed by an etching process (e.g., RIE) can be conducted on the semiconductor structure 100 to selectively remove portions of the first semiconductor layer 106 which further increases a size of the third openings 840 (FIGS. 8A-8C). Selective etching of the first semiconductor layer 106 may be conducted according to a desired location of subsequently formed backside metal contacts.

According to an embodiment, a layer of any suitable material for forming the placeholder layer 920 can be deposited within the expanded third openings 840 (not shown). In one or more embodiments, the material forming the placeholder layer 920 may include, for example, SiGe, AlOx, TiOx, and the like. Specifically, the material forming the placeholder layer 920 substantially fills recesses formed within the first semiconductor layer 106 after further increasing a size of the third openings 840 (not shown). The placeholder layer 920 acts, as implied by the name, as placeholder for subsequently formed backside metal contacts.

The process continues by forming source/drain regions 930. As known by those skilled in the art, source/drain regions are formed within NFET and PFET regions 12, 16 (shown in FIG. 1) of the semiconductor structure 100 using methods well-known in the art. For example, the source/drain regions 930 can be formed using an epitaxial layer growth process on the exposed ends of the semiconductor channel layers 112.

The source/drain regions 930 can be formed on opposing sides of the nanosheet fins 302 in direct contact with end portions of the semiconductor channel layers 112 and end portions of the inner spacers 808. A top portion of the source/drain regions 930 may include a diamond shape consequence of the different growth rates during the epitaxial deposition process inherent to each crystallographic orientation plane of the material forming the source/drain regions 930. In other embodiments, the source/drain regions 930 may have a shape other than the diamond shape depicted in FIG. 9A.

With reference now to FIG. 9D, a top-down view of the semiconductor structure 100 depicts an exemplary location 940 of a plurality of subsequently formed backside metal contacts within first cell height area 30A and second cell height area 30B achieved by implementing the processing steps previously described.

Figure 10B:
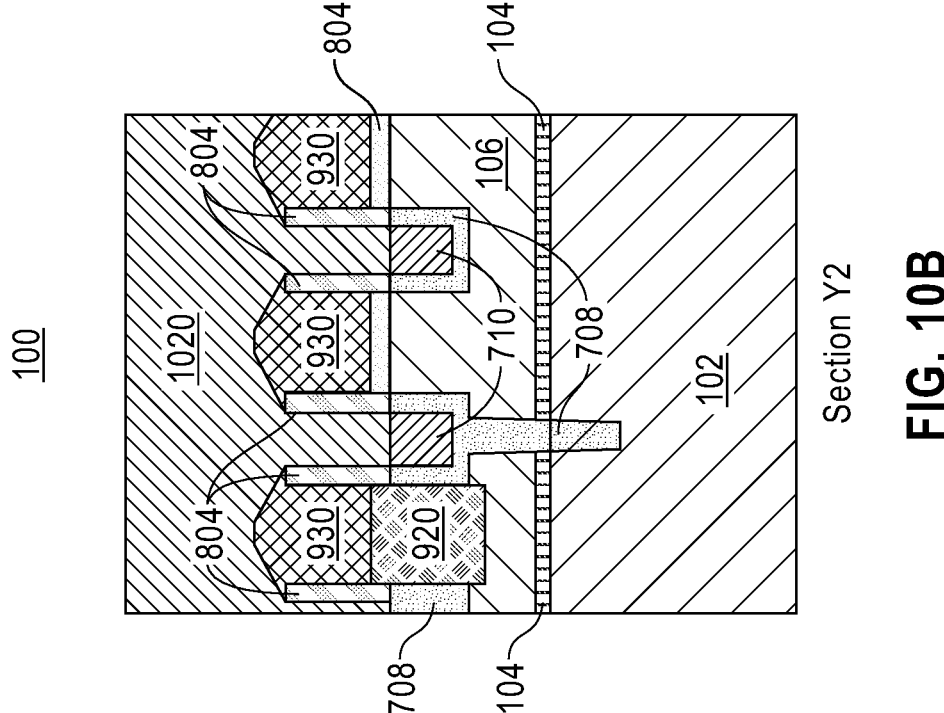
FIG. 10B is a cross-sectional view of the semiconductor structure taken along line Y2-Y2', as depicted in FIG. 1, according to an embodiment of the present disclosure.
Figure 10A:
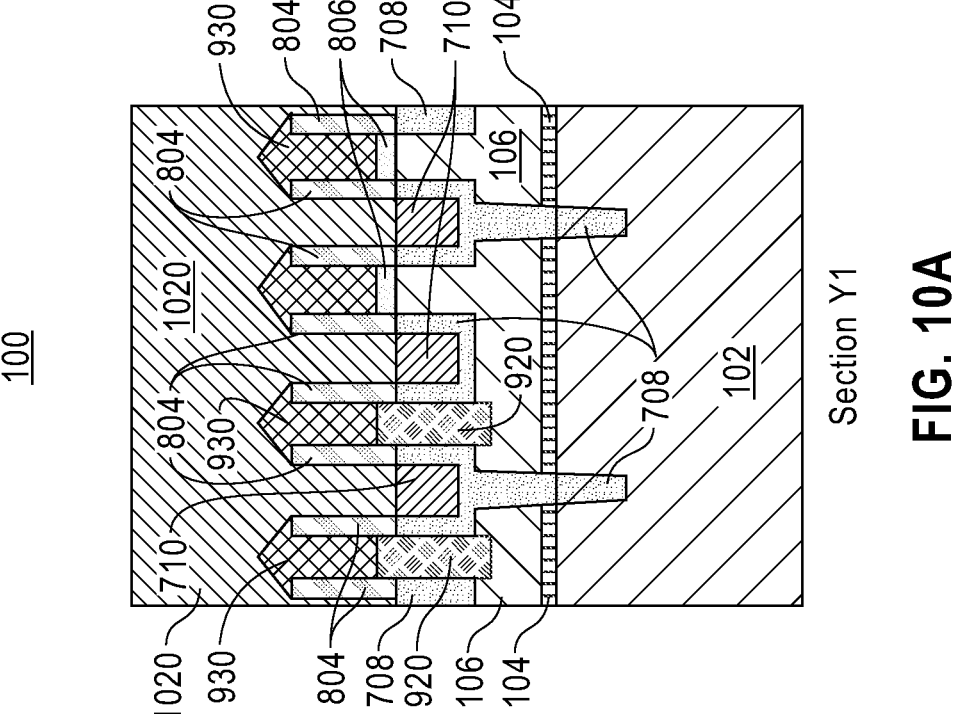
FIG. 10A is a cross-sectional view of the semiconductor structure taken along line Y1-Y1', as depicted in FIG. 1, after completing front-end-of-line (FEOL) processing steps, according to an embodiment of the present disclosure.
Figure 10C:
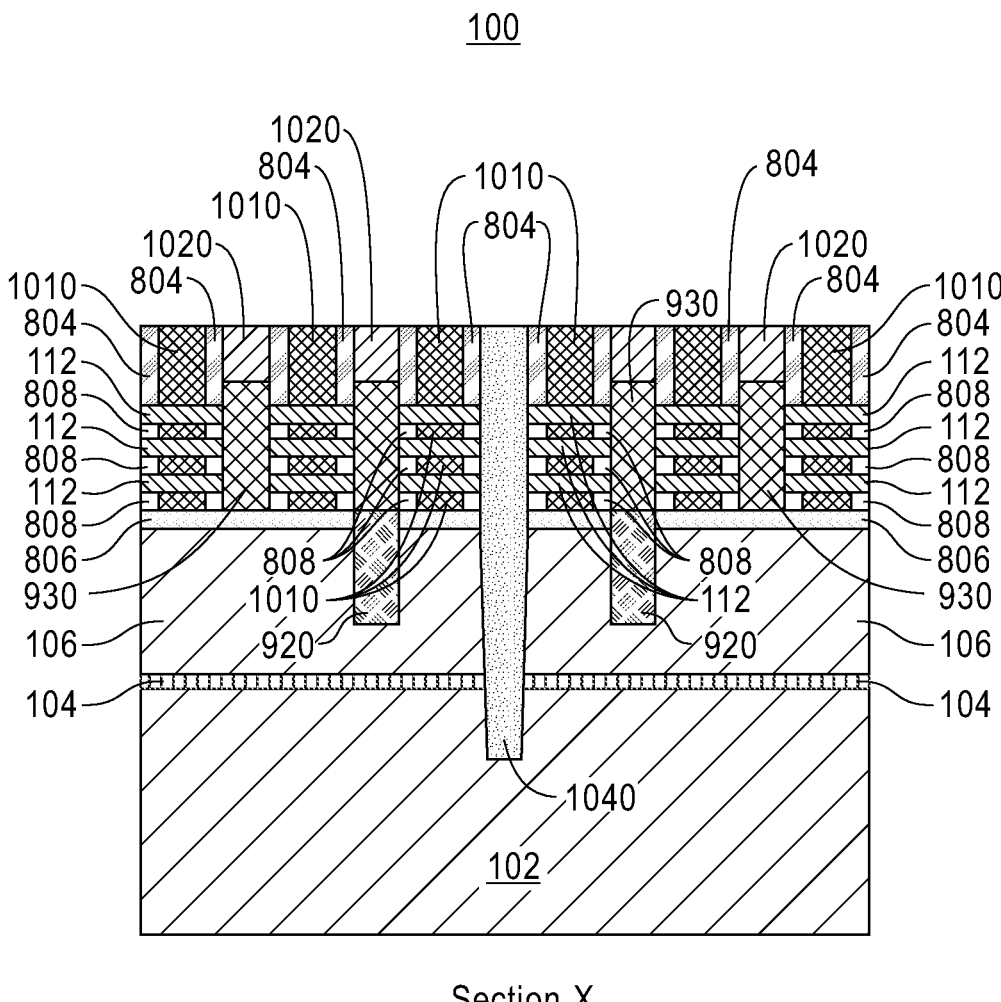
FIG. 10C is a cross-sectional view of the semiconductor structure taken along line X-X', as depicted in FIG. 1, according to an embodiment of the present disclosure.

Referring now to FIGS. 10A-10C, cross-sectional views of the semiconductor structure 100 are shown after completing front-end-of-line (FEOL) processing steps, according to an embodiment of the present disclosure. In this embodiment, FIG. 10A is a cross-sectional view of the semiconductor structure 100 taken along line Y1-Y1', as depicted in FIG. 1; FIG. 10B is a cross-sectional view of the semiconductor structure 100 taken along line Y2-Y2', as depicted in FIG. 1; and FIG. 10C is a cross-sectional view of the semiconductor structure 100 taken along line X-X', as depicted in FIG. 1.

Figure 12B:
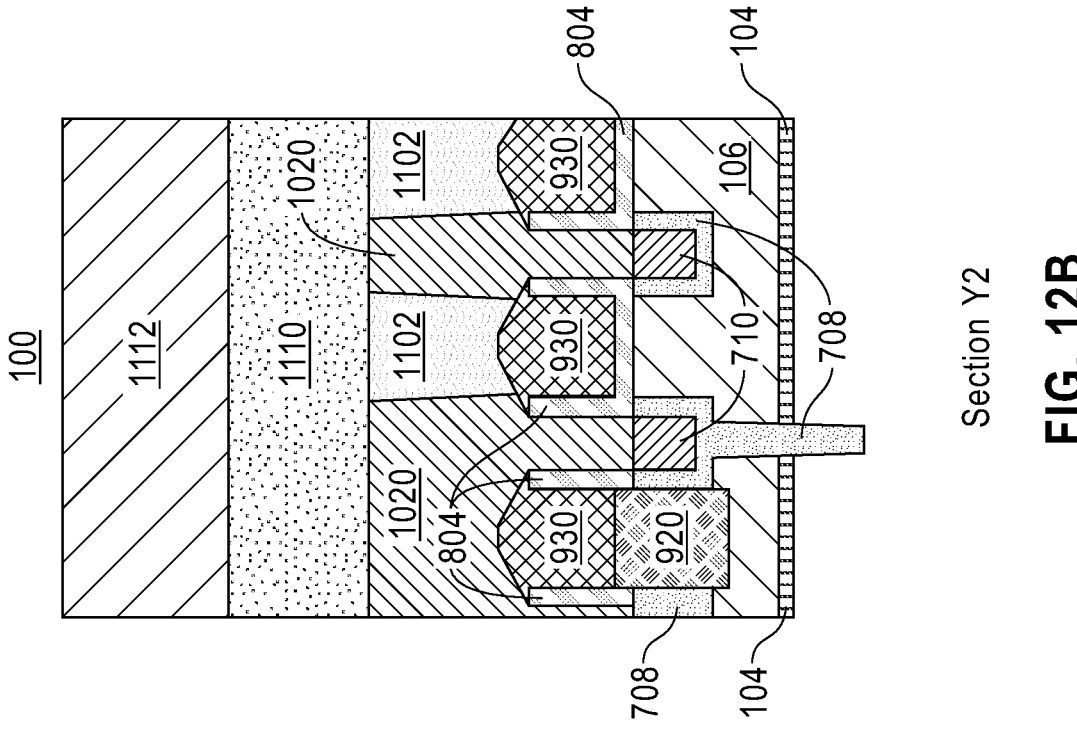
FIG. 12B is a cross-sectional view of the semiconductor structure taken along line Y2-Y2', as depicted in FIG. 1, according to an embodiment of the present disclosure.
Figure 12A:
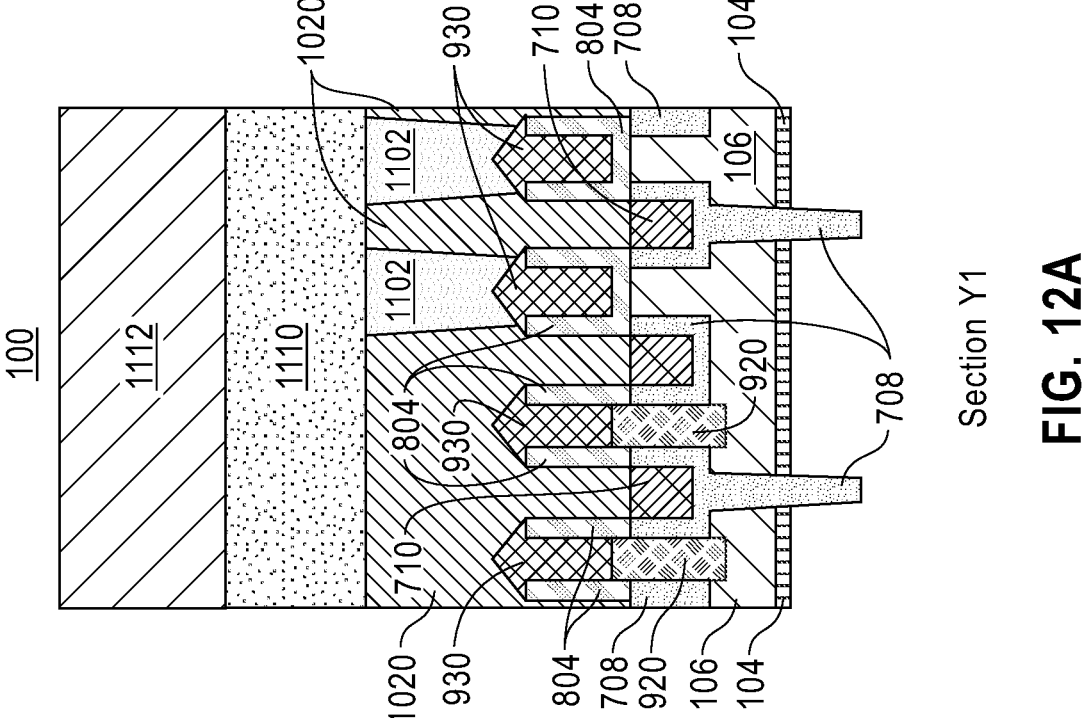
FIG. 12A is a cross-sectional view of the semiconductor structure taken along line Y1-Y1', as depicted in FIG. 1, after removing the substrate, according to an embodiment of the present disclosure.
Figure 12C:
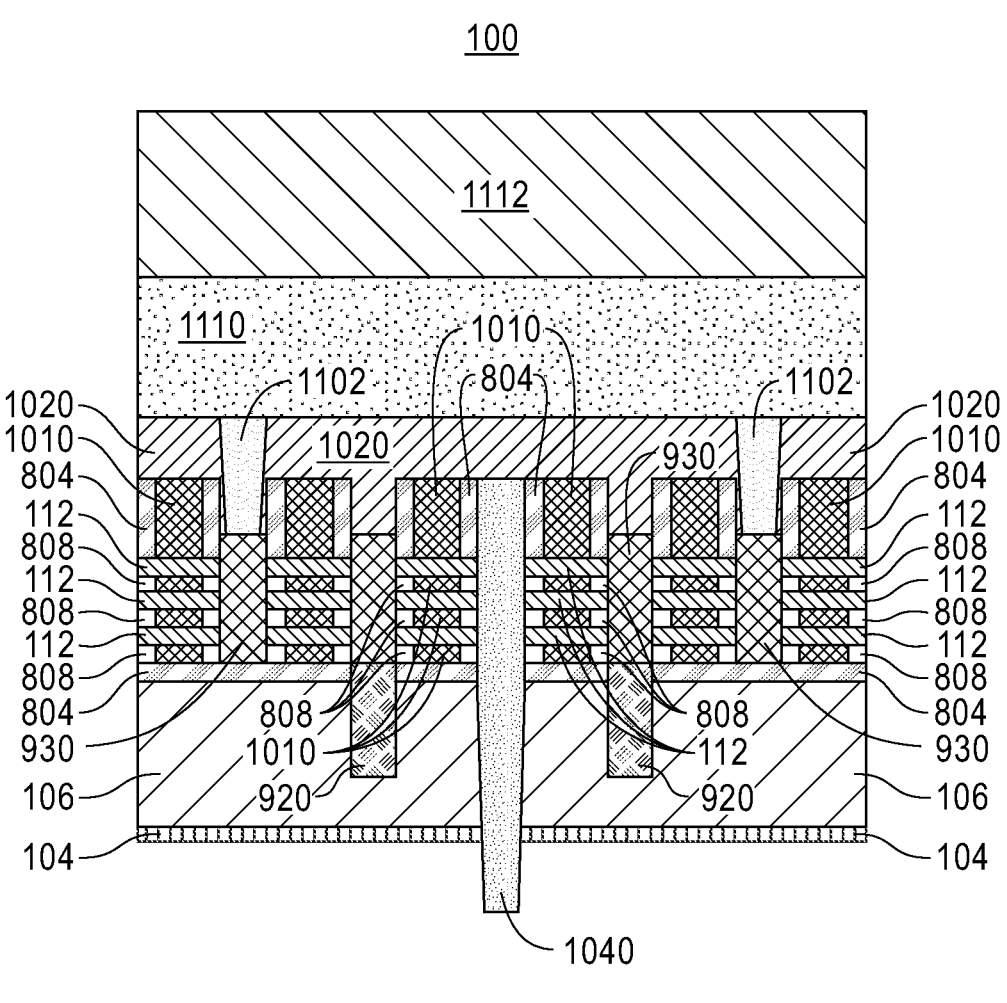
FIG. 12C is a cross-sectional view of the semiconductor structure taken along line X-X', as depicted in FIG. 1, according to an embodiment of the present disclosure.

Known semiconductor fabrication operations have been used to form the semiconductor structure 100 as depicted in FIGS. 12A-12C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

After forming the source/drain regions 930, an interlevel dielectric layer 1020 can be formed to fill voids in the semiconductor structure 100. The interlevel dielectric layer 1020 can be formed by, for example, CVD of a dielectric material. Non-limiting examples of dielectric materials to form the interlevel dielectric layer 1020 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the interlevel dielectric layer 1020, a planarization process (e.g., CMP) can be conducted on the semiconductor structure 100. This process exposes a top surface of the dummy gate 810 (FIG. 9C) in preparation for a replacement metal gate process, as will be described in detail below.

Accordingly, the dummy gate 810 (FIG. 9C) is removed from the semiconductor structure 100. As known in the art, in a gate-last fabrication process, the removed dummy gate is thereafter replaced with a high-k metal gate structure, i.e., replacement gate 1010. According to an embodiment, the second sacrificial semiconductor layers 110 (FIG. 9C) can also be removed from the semiconductor structure 100 using known etching processes including, for example, RIE, wet etch or dry gas (HCl). Removal of the sacrificial semiconductor layers 110 (FIG. 9C) create cavities (not shown) between the inner spacers 808 that will subsequently be filled with corresponding gate dielectric and work function metals to form the high-k metal gate structure or replacement gate 1010, as depicted in FIG. 10C.

The replacement gate 1010 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). The replacement gate 1010 surrounds (stacked) semiconductor channel layers 112. In one or more embodiments, a gate cap (not shown) may be formed above the replacement gate 1010. After forming the replacement gate 1010, a chemical mechanical polishing (CMP) may be conducted to remove excess material and polish upper surfaces of the semiconductor structure 100.

In one or more embodiments, a gate cut process can be conducted on the semiconductor structure 100 for isolating gate structures from different CMOS cells. During the process, a gate cut region (not depicted in the figures) can be formed either before replacement metal gate (RMG) or after RMG, and then filled with dielectric materials such as $SiO_2$, SiN, SiBCN, SiOCN, SiOC, SiC, and the like. A similar process can be conducted to form a diffusion break isolation region 1040 between two adjacent "active" nanosheet fins 302, as depicted in FIG. 10C, for preventing undesirable current flow between the two active nanosheet fins 302 of the semiconductor structure 100. It should be noted that the diffusion break region 1040 extends deeper than the etch stop layer 104, which is helpful to form self-aligned backside metal lines.

Figure 11B:
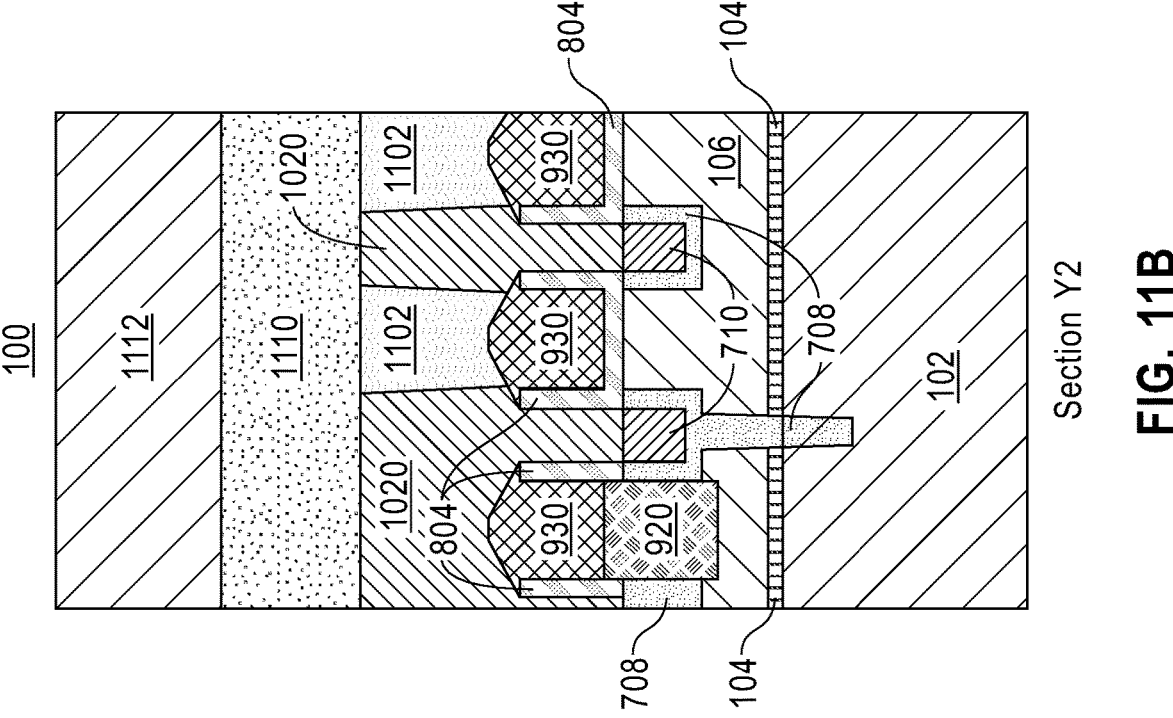
FIG. 11B is a cross-sectional view of the semiconductor structure taken along line Y2-Y2', as depicted in FIG. 1, according to an embodiment of the present disclosure.
Figure 11A:
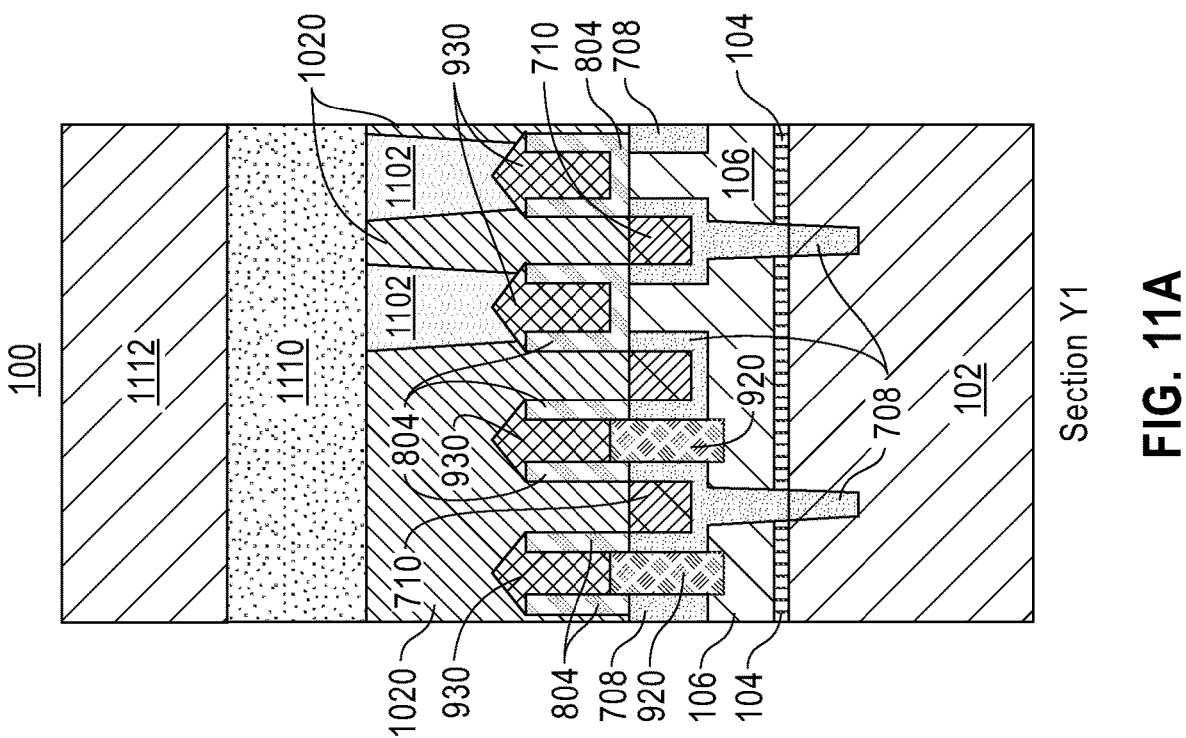
FIG. 11A is a cross-sectional view of the semiconductor structure taken along line Y1-Y1', as depicted in FIG. 1, after conducting middle-of-line (MOL) contact patterning and metallization and forming a back-end-of-line (BEOL) interconnect level and a carrier wafer, according to an embodiment of the present disclosure.
Figure 11C:
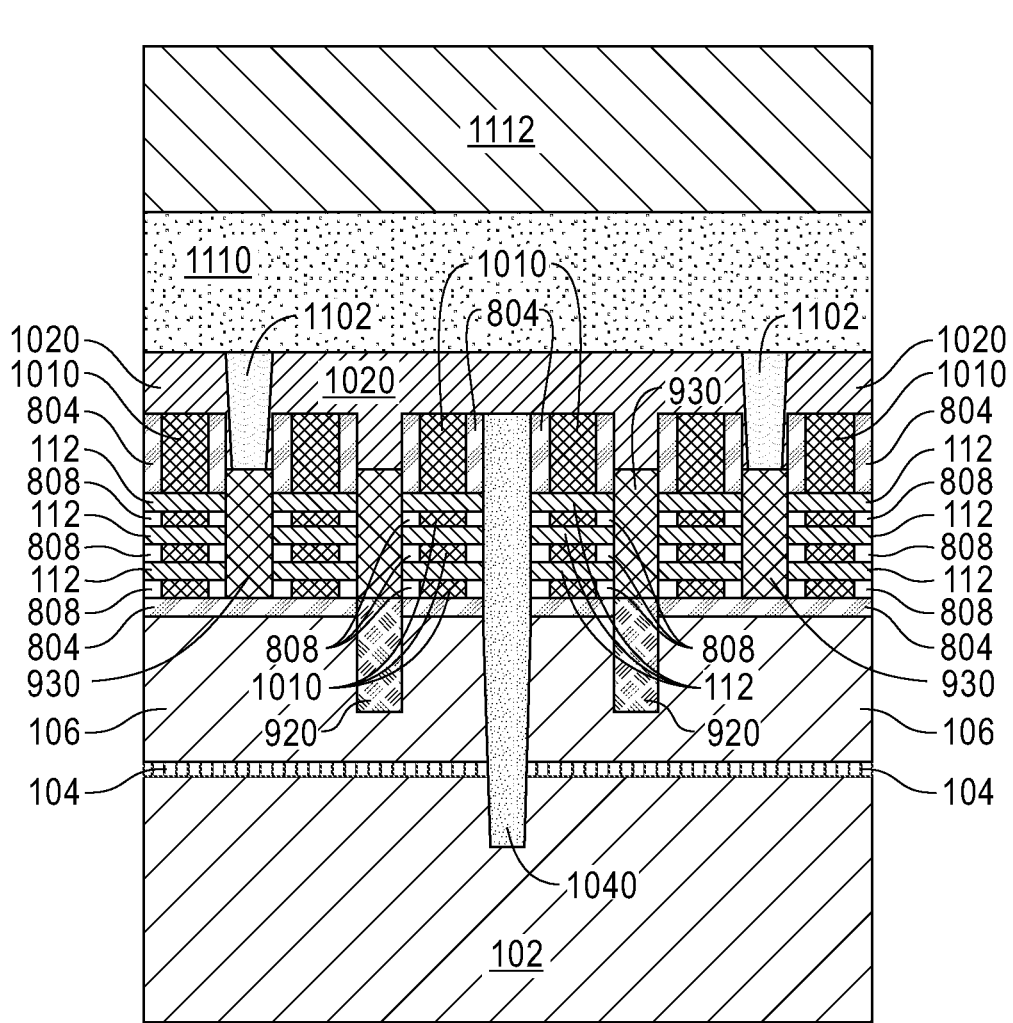
FIG. 11C is a cross-sectional view of the semiconductor structure taken along line X-X', as depicted in FIG. 1, according to an embodiment of the present disclosure.

Referring now to FIGS. 11A-11C, cross-sectional views of the semiconductor structure 100 are shown after conducting middle-of-line (MOL) contact patterning and metallization and forming a back-end-of-line (BEOL) interconnect level 1110 and a carrier wafer 1112, according to an embodiment of the present disclosure. In this embodiment, FIG. 11A is a cross-sectional view of the semiconductor structure 100 taken along line Y1-Y1', as depicted in FIG. 1; FIG. 11B is a cross-sectional view of the semiconductor structure 100 taken along line Y2-Y2', as depicted in FIG. 1; and FIG. 11C is a cross-sectional view of the semiconductor structure 100 taken along line X-X', as depicted in FIG. 1.

In the depicted embodiment, a plurality of conductive structures including metal contacts 1102 are formed in the semiconductor structure 100 for electrically connecting FEOL devices to subsequently formed metal levels. The process of forming the metal contacts 1102 is standard and well-known in the art. Typically, the process includes forming trenches (not shown) within interlevel dielectric layer 1020 and subsequently filling the trenches with a conductive material or a combination of conductive materials to form the metal contacts 1102. In one or more embodiments, the conductive material filling the metal contacts 1102 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. Specifically, in the depicted example, metal contacts 1102 may include source/drain contacts (CA) that extend until an uppermost surface of source/drain regions 930, and gate contacts (CB) to the replacement gate 1010 (not shown).

According to an embodiment, BEOL interconnect level 1110 can then be formed above, and electrically connected to, FEOL device level 30 of the semiconductor structure 100. Although not depicted in the figures, the BEOL interconnect level 1110 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1110, the semiconductor structure 100 (i.e., the semiconductor wafer) is bonded to the carrier wafer (or auxiliary substrate) 1112. The carrier wafer 1112 may act as a reinforcing substrate for providing mechanical strength during processing (e.g., thinning) of the semiconductor wafer. The process of bonding the semiconductor wafer to the carrier wafer 1112 can be achieved by conventional wafer bonding process, such as dielectric-to-dielectric bonding or Cu-to-Cu bonding.

Accordingly, the carrier wafer 1112 may include silicon oxide layers or SiCN layers, or any other layers applicable in the direct bonding technology applied in state-of-the-art packaging techniques. Bonding of the device wafer to the carrier wafer 1112 takes place by such known direct bonding techniques, thus obtaining the assembly shown in FIGS. 11A-11C. Although not depicted in the figures, after bonding of the device wafer to the carrier wafer 1112 the wafer is flipped.

Referring now to FIGS. 12A-12C, cross-sectional views of the semiconductor structure 100 are shown after removing substrate 102 (FIGS. 11A-11C), according to an embodiment of the present disclosure. In this embodiment, FIG. 12A is a cross-sectional view of the semiconductor structure 100 taken along line Y1-Y1', as depicted in FIG. 1; FIG. 12B is a cross-sectional view of the semiconductor structure 100 taken along line Y2-Y2', as depicted in FIG. 1; and FIG. 12C is a cross-sectional view of the semiconductor structure 100 taken along line X-X', as depicted in FIG. 1.

In the depicted embodiment, after the wafer is flipped (not shown), the substrate 102 (FIGS. 11A-11C) can be removed using regular grinding, CMP and selective etching processes including wet or dry etching techniques. In one or more embodiments, the grinding process is conducted until substantially removing the substrate 102 from the semiconductor structure 100 and only a few microns of Si remain. After that, an optional CMP process can be further used to reduce the thickness variation, and finally a highly selective Si etching process is used to remove the remaining substrate 102 from the semiconductor structure 100 selective to the first sacrificial layer 104 and STI liner 708. In the depicted embodiment, the first sacrificial layer 104 act as an etch stop during the highly selective Si removal process, preventing excessive Si etch which may damage the replacement gate 1010 and source/drain regions 930.

Figure 13B:
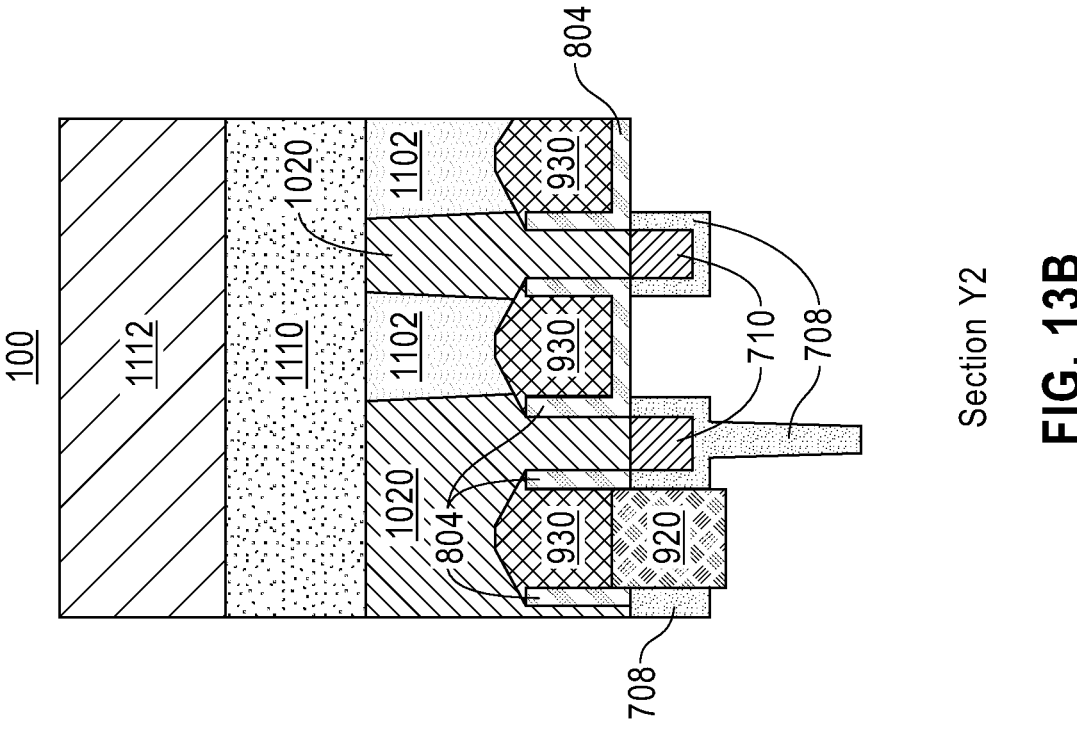
FIG. 13B is a cross-sectional view of the semiconductor structure taken along line Y2-Y2', as depicted in FIG. 1, according to an embodiment of the present disclosure.
Figure 13A:
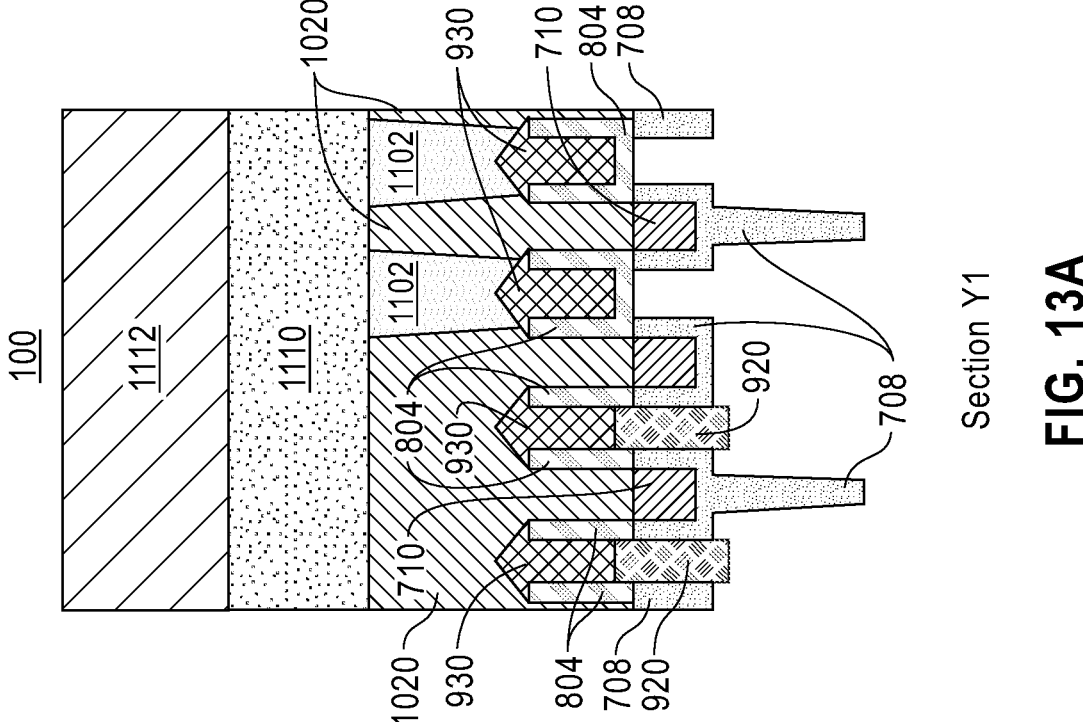
FIG. 13A is a cross-sectional view of the semiconductor structure taken along line Y1-Y1', as depicted in FIG. 1, after removing the first sacrificial layer and removing remaining Si-containing areas, according to an embodiment of the present disclosure.
Figure 13C:
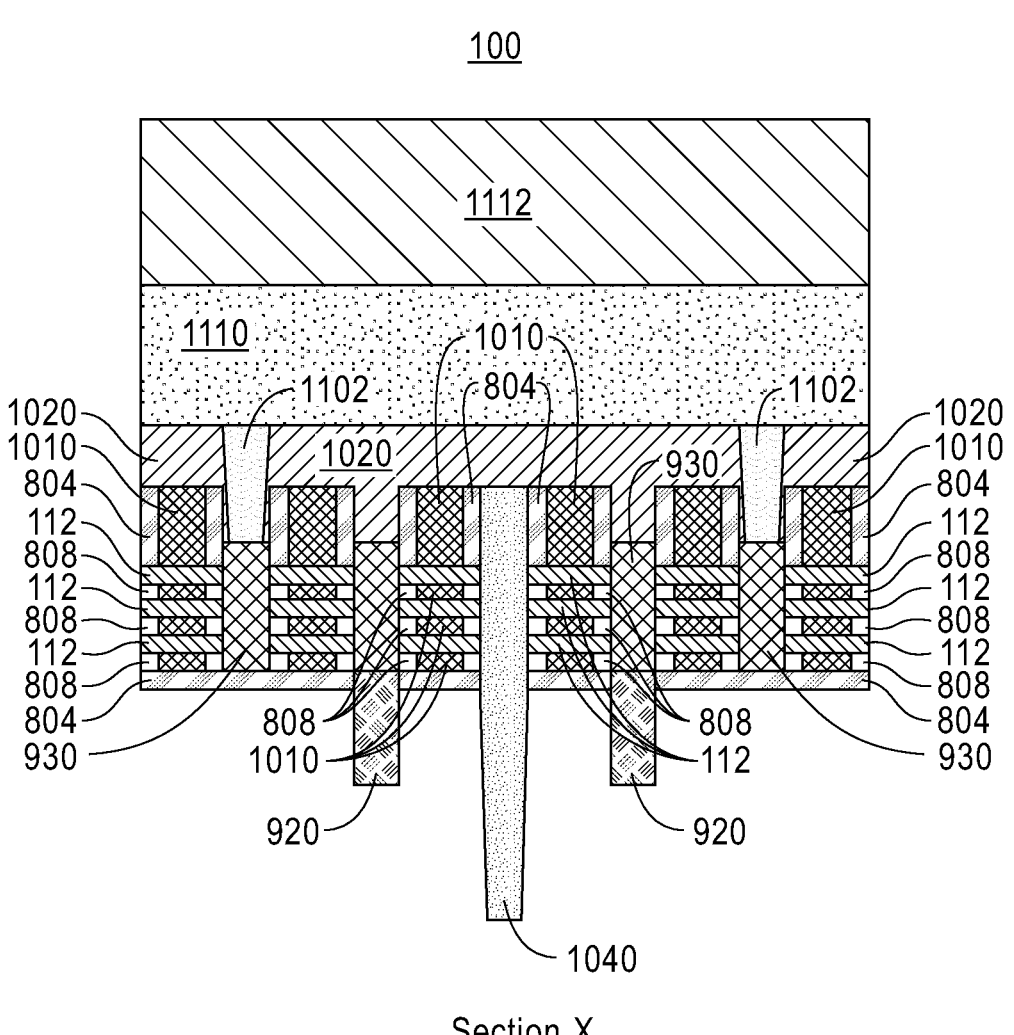
FIG. 13C is a cross-sectional view of the semiconductor structure taken along line X-X', as depicted in FIG. 1, according to an embodiment of the present disclosure.

Referring now to FIGS. 13A-13C, cross-sectional views of the semiconductor structure 100 are shown after removing the first sacrificial layer 104 and removing remaining Si-containing areas (i.e., the first semiconductor layer 106) depicted in FIGS. 12A-12C, according to an embodiment of the present disclosure. In this embodiment, FIG. 13A is a cross-sectional view of the semiconductor structure 100 taken along line Y1-Y1', as depicted in FIG. 1; FIG. 13B is a cross-sectional view of the semiconductor structure 100 taken along line Y2-Y2', as depicted in FIG. 1; and FIG. 13C is a cross-sectional view of the semiconductor structure 100 taken along line X-X', as depicted in FIG. 1.

Any suitable etching technique may be used to remove the first sacrificial layer 104 (FIGS. 12A-12C) selective to STI liner 708. In embodiments in which the first sacrificial layer 104 (FIGS. 12A-12C) is made of SiGe a hot SC1 or dry HCl etch can be used to remove the first sacrificial layer 104. In embodiments in which the first sacrificial layer 104 (FIGS. 12A-12C) is made of $SiO_2$, DHF wet clean can be used to remove the first sacrificial layer 104.

In one or more embodiments, a process like the one described in FIGS. 12A-12C for removing the substrate 102 can be conducted to remove the first semiconductor layer 106 from the semiconductor structure 100. Selective removal of the first sacrificial layer 104 and first semiconductor layer 106 (FIGS. 12A-12C) exposes the placeholder layer 920, STI liner 708 and bottom dielectric isolation 806.

Figure 14B:
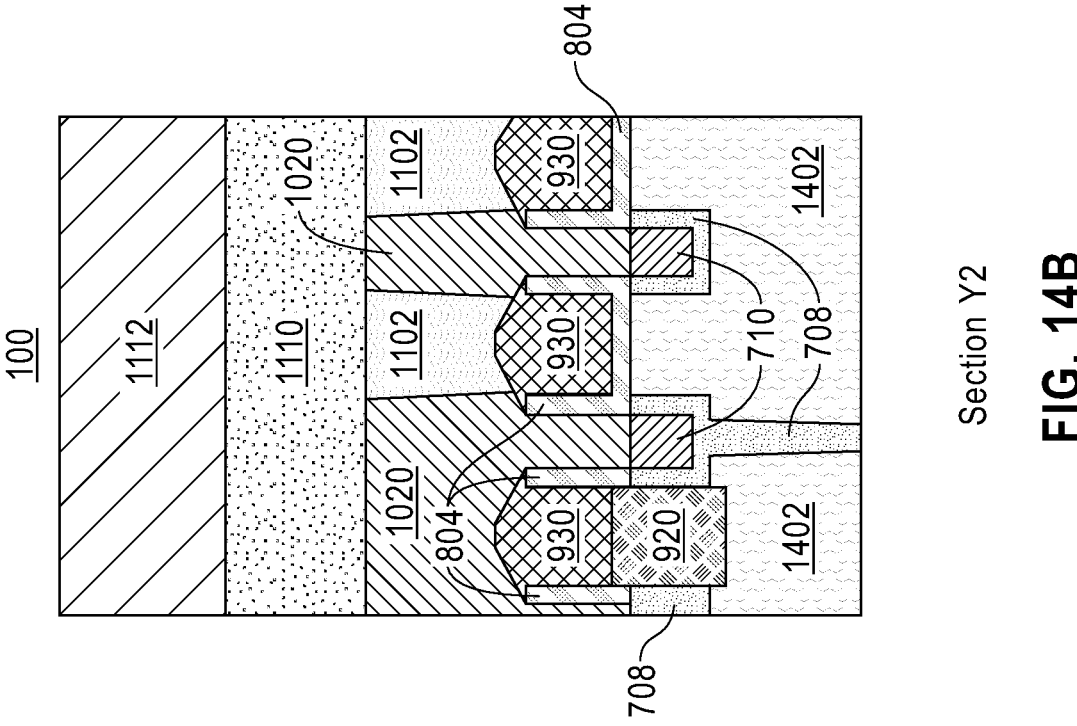
FIG. 14B is a cross-sectional view of the semiconductor structure taken along line Y2-Y2', as depicted in FIG. 1, according to an embodiment of the present disclosure.
Figure 14A:
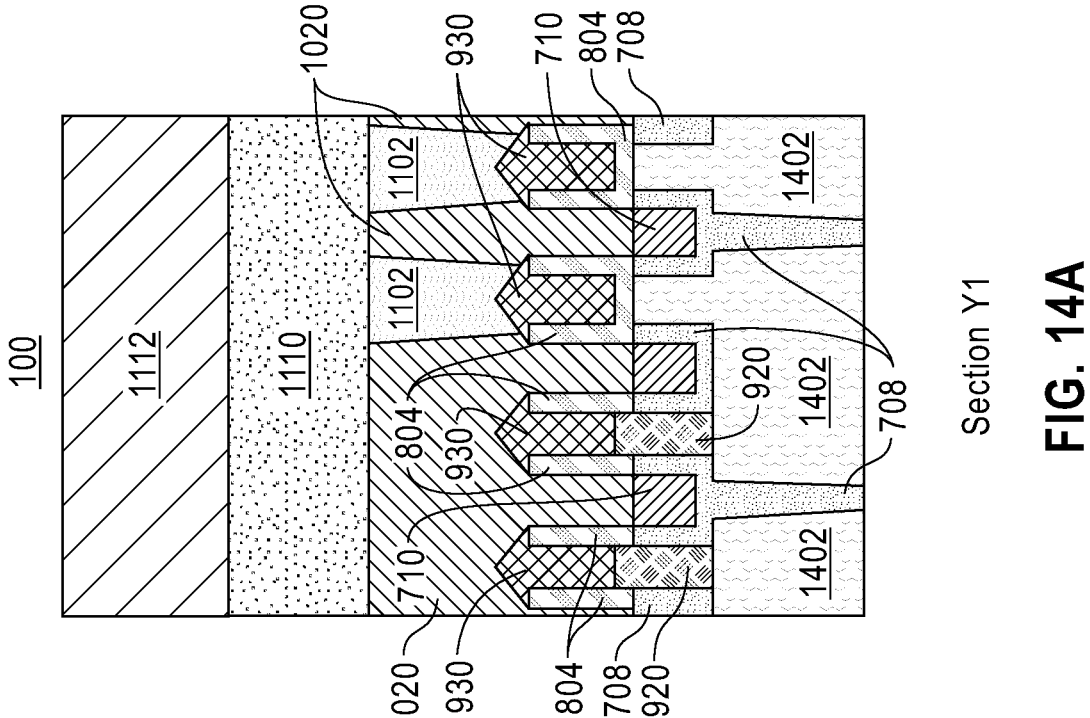
FIG. 14A is a cross-sectional view of the semiconductor structure taken along line Y1-Y1', as depicted in FIG. 1, after forming a first backside interlayer dielectric, according to an embodiment of the present disclosure.
Figure 14C:
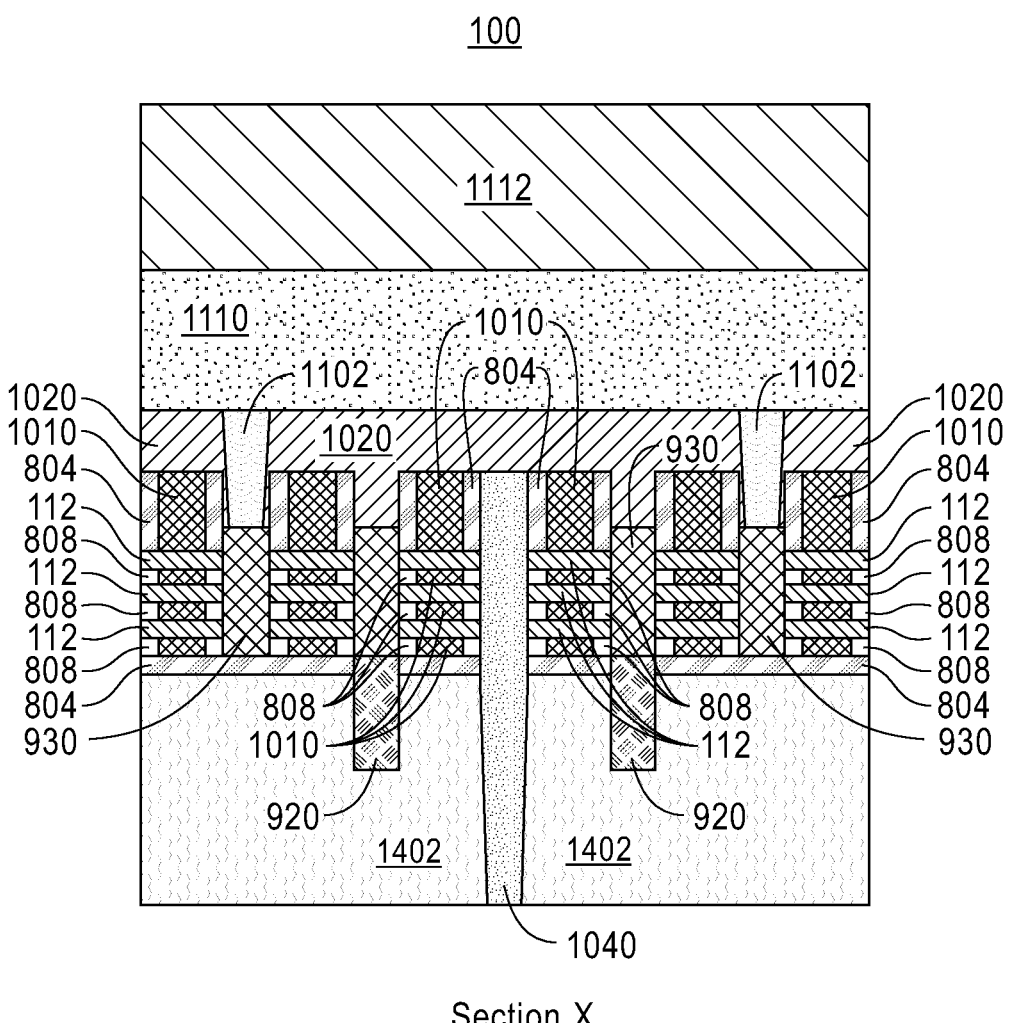
FIG. 14C is a cross-sectional view of the semiconductor structure taken along line X-X', as depicted in FIG. 1, according to an embodiment of the present disclosure.

Referring now to FIGS. 14A-14C, cross-sectional views of the semiconductor structure 100 are shown after forming a first backside interlayer dielectric (BILD) 1402, according to an embodiment of the present disclosure. In this embodiment, FIG. 14A is a cross-sectional view of the semiconductor structure 100 taken along line Y1-Y1', as depicted in FIG. 1; FIG. 14B is a cross-sectional view of the semiconductor structure 100 taken along line Y2-Y2', as depicted in FIG. 1; and FIG. 14C is a cross-sectional view of the semiconductor structure 100 taken along line X-X', as depicted in FIG. 1.

The first BILD 1402 is formed using standard methods and materials, such as those used to form the interlevel dielectric layer 1020 described above with reference to FIGS. 10A-10C. As depicted in FIGS. 14A-14C, the first BILD 1402 is disposed above and in direct contact with exposed surfaces of the placeholder layer 920, STI liner 708 and bottom dielectric isolation layer 806. In an exemplary embodiment, a thickness of the first BILD 1402 may vary between approximately 40 nm to approximately 300 nm, and ranges therebetween. In one or more embodiments, a planarization process (e.g., CMP) can be conducted on the semiconductor structure 100 after forming the first BILD 1402. After the planarization process, an exposed surface of the STI liner 708 is substantially coplanar with the first BILD 1402.

Figure 15B:
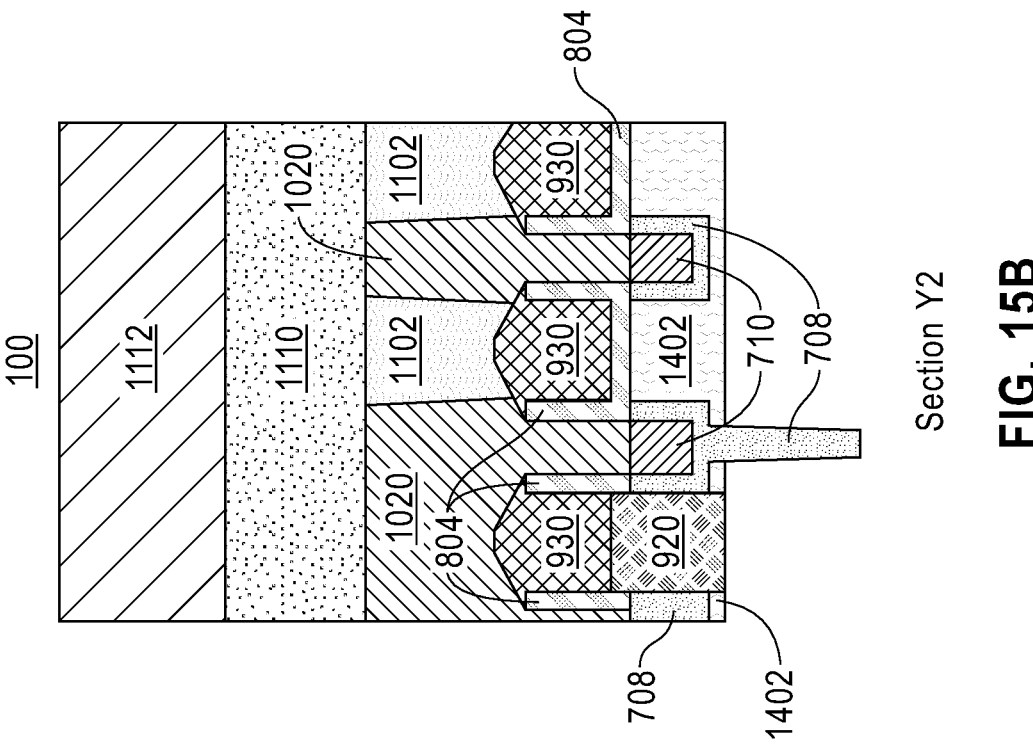
FIG. 15B is a cross-sectional view of the semiconductor structure taken along line Y2-Y2', as depicted in FIG. 1, according to an embodiment of the present disclosure.
Figure 15A:
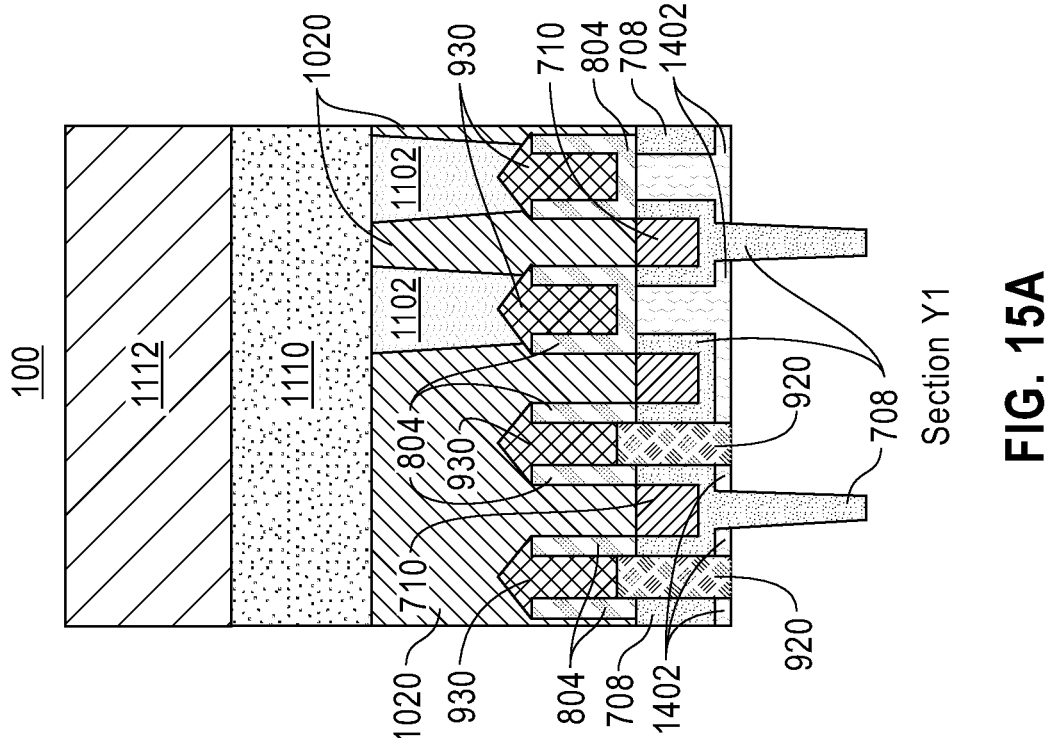
FIG. 15A is a cross-sectional view of the semiconductor structure taken along line Y1-Y1', as depicted in FIG. 1, after recessing the first BILD to reveal the placeholder layer, according to an embodiment of the present disclosure.
Figure 15C:
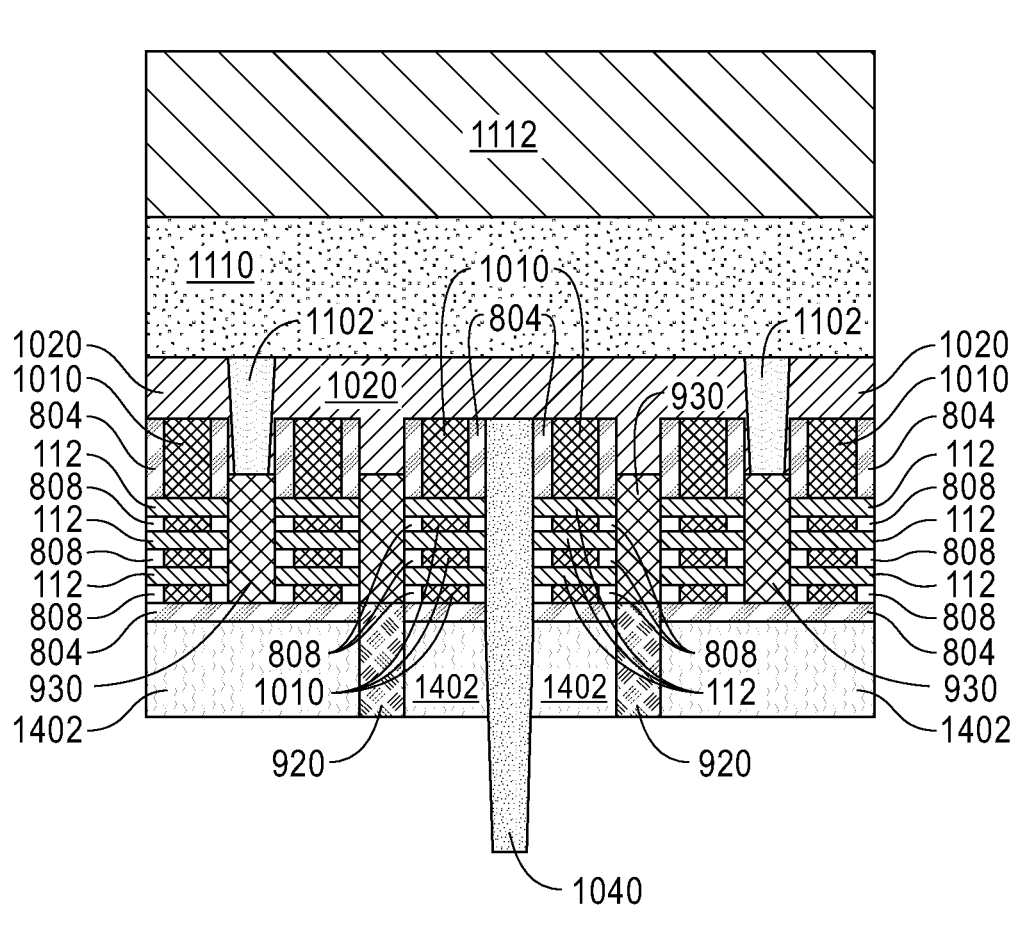
FIG. 15C is a cross-sectional view of the semiconductor structure taken along line X-X', as depicted in FIG. 1, according to an embodiment of the present disclosure.

Referring now to FIGS. 15A-15C, cross-sectional views of the semiconductor structure 100 are shown after recessing the first BILD 1402 to reveal the placeholder layer 920, according to an embodiment of the present disclosure. In this embodiment, FIG. 15A is a cross-sectional view of the semiconductor structure 100 taken along line Y1-Y1', as depicted in FIG. 1; FIG. 15B is a cross-sectional view of the semiconductor structure 100 taken along line Y2-Y2', as depicted in FIG. 1; and FIG. 15C is a cross-sectional view of the semiconductor structure 100 taken along line X-X', as depicted in FIG. 1.

The first BILD 1402 can be recessed using any selective etching technique known in the art, such that the process of recessing the first BILD 1402 does not affect the STI liner 708 or the diffusion break isolation region 1040, as depicted in the figures. In an exemplary embodiment, a wet DHF etch process can be conducted to selectively etch the first BILD 1402.

Figure 16B:
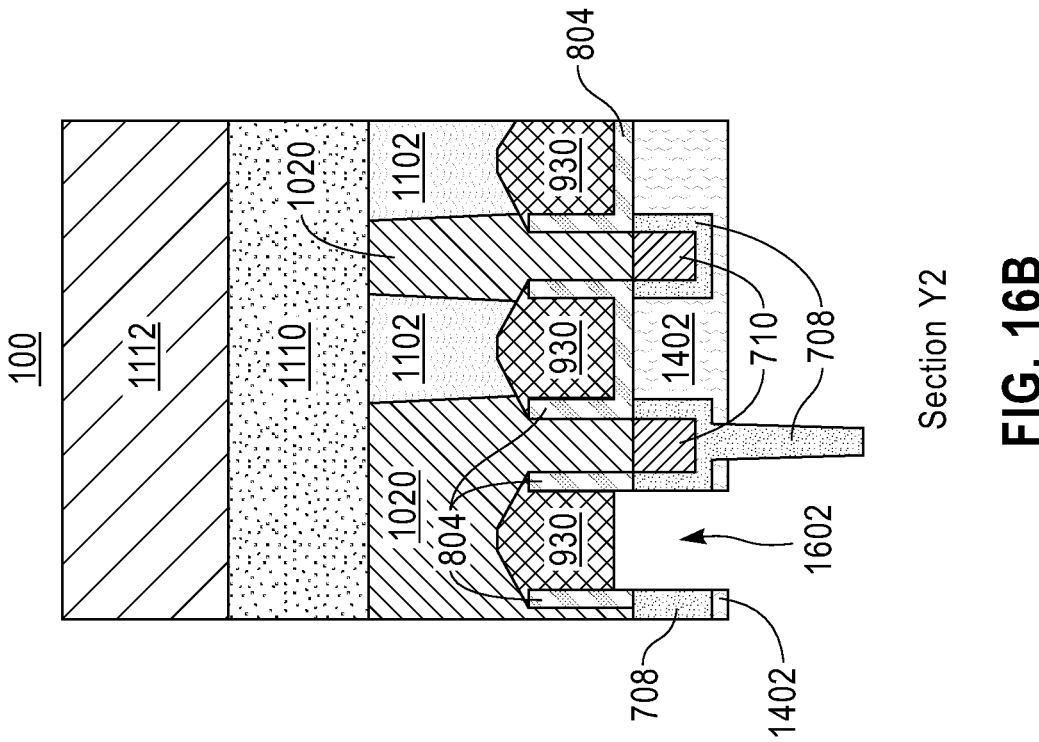
FIG. 16B is a cross-sectional view of the semiconductor structure 100 taken along line Y2-Y2', as depicted in FIG. 1, as depicted in FIG. 1, according to an embodiment of the present disclosure.
Figure 16A:
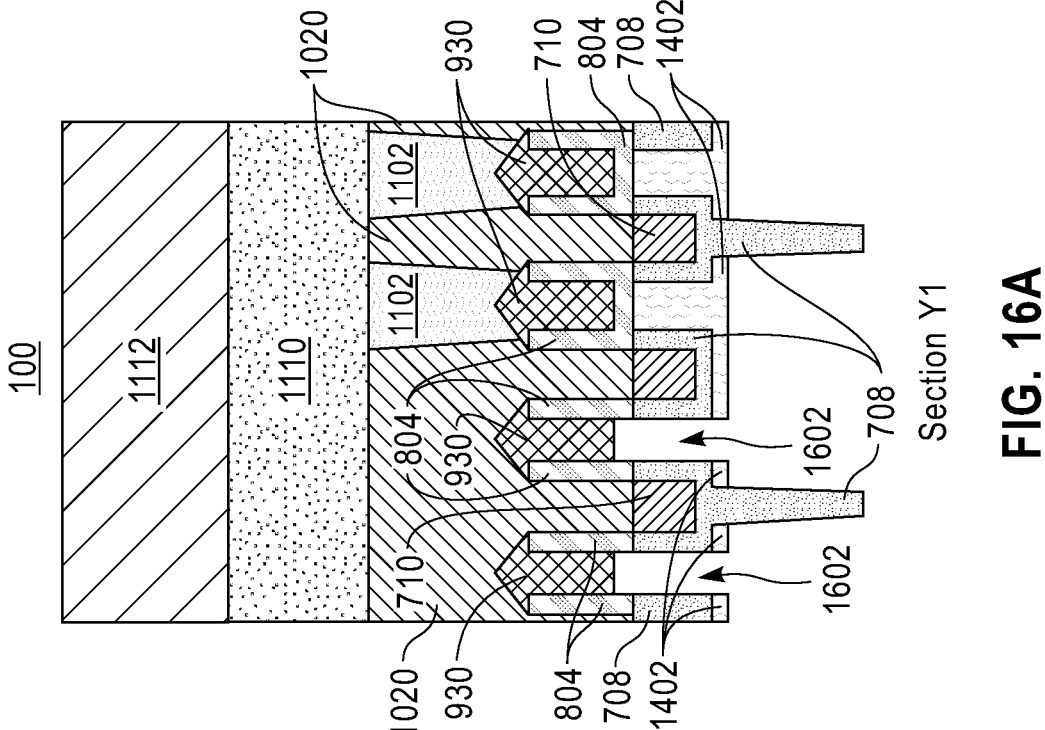
FIG. 16A is a cross-sectional view of the semiconductor structure taken along line Y1-Y1', as depicted in FIG. 1, after selectively removing the placeholder layer, according to an embodiment of the present disclosure.
Figure 16C:
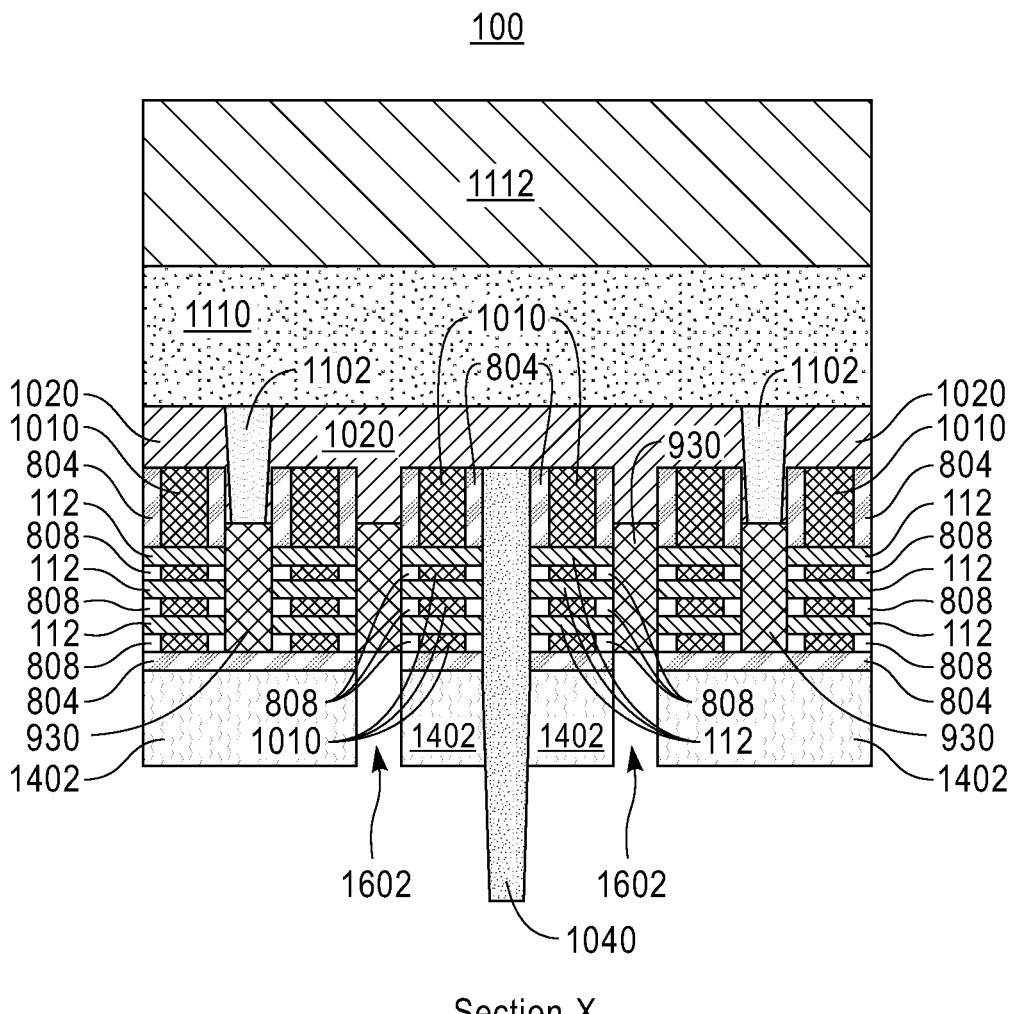
FIG. 16C is a cross-sectional view of the semiconductor structure taken along line X-X', as depicted in FIG. 1, as depicted in FIG. 1, according to an embodiment of the present disclosure.

Referring now to FIGS. 16A-16C, cross-sectional views of the semiconductor structure 100 are shown after selectively removing the placeholder layer 920 depicted in FIGS. 15A-15C, according to an embodiment of the present disclosure. In this embodiment, FIG. 16A is a cross-sectional view of the semiconductor structure 100 taken along line Y1-Y1', as depicted in FIG. 1; FIG. 16B is a cross-sectional view of the semiconductor structure 100 taken along line Y2-Y2', as depicted in FIG. 1; and FIG. 16C is a cross-sectional view of the semiconductor structure 100 taken along line X-X', as depicted in FIG. 1.

In the depicted embodiment, fourth openings 1602 are formed in the semiconductor structure 100 after removing the placeholder layer 920 (FIGS. 15A-15C). The fourth openings 1602 (i.e., backside contact vias) expose one or more of the source/drain regions 930, as depicted in FIGS. 16A-16C. More particularly, an area of the source/drain regions 930 exposed by the fourth openings 1602 corresponds to a first or bottom surface opposing a second or top surface of one or more of the source/drain regions 930 in contact with the interlevel dielectric layer 1020. As can be observed in the figures, the fourth openings 1602 expose the first or bottom surface of at least one source/drain region 930 adjacent to at least another source/drain region 930 that is in electric contact with a metal contact 1102. Exemplary techniques suitable for removing the placeholder layer 920 (FIGS. 15A-15C) from the semiconductor structure 100 may include, but are not limited to, dry HCl etch which may cause minimal or no damage to the underlying layers.

Figure 17B:
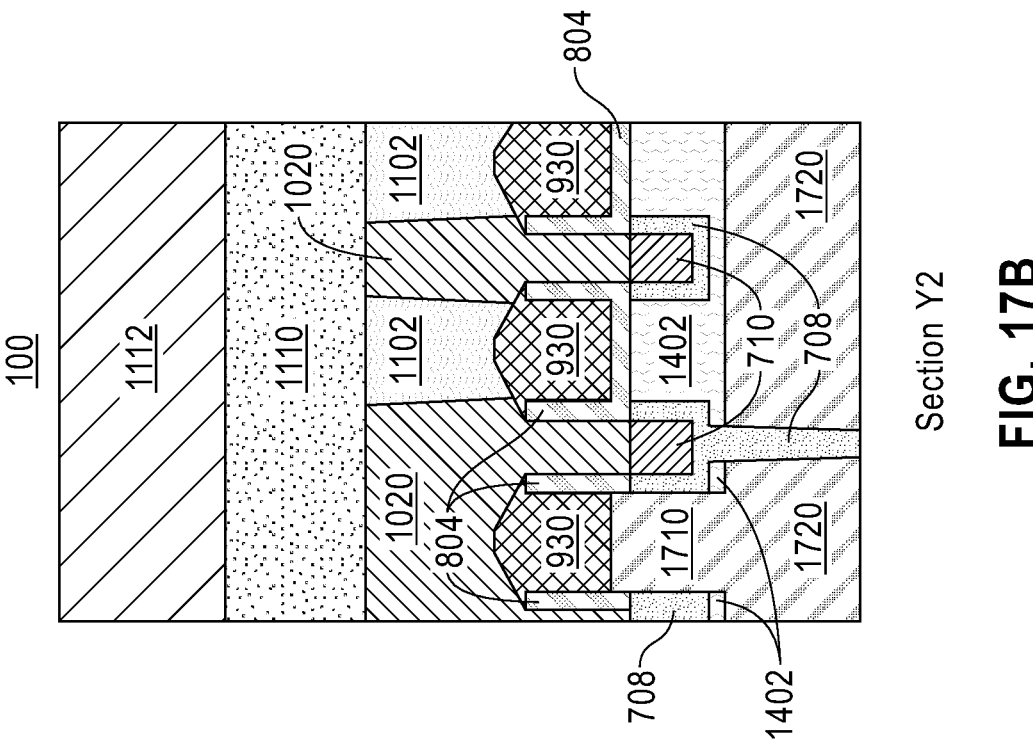
FIG. 17B is a cross-sectional view of the semiconductor structure taken along line Y2-Y2', as depicted in FIG. 1, according to an embodiment of the present disclosure.
Figure 17A:
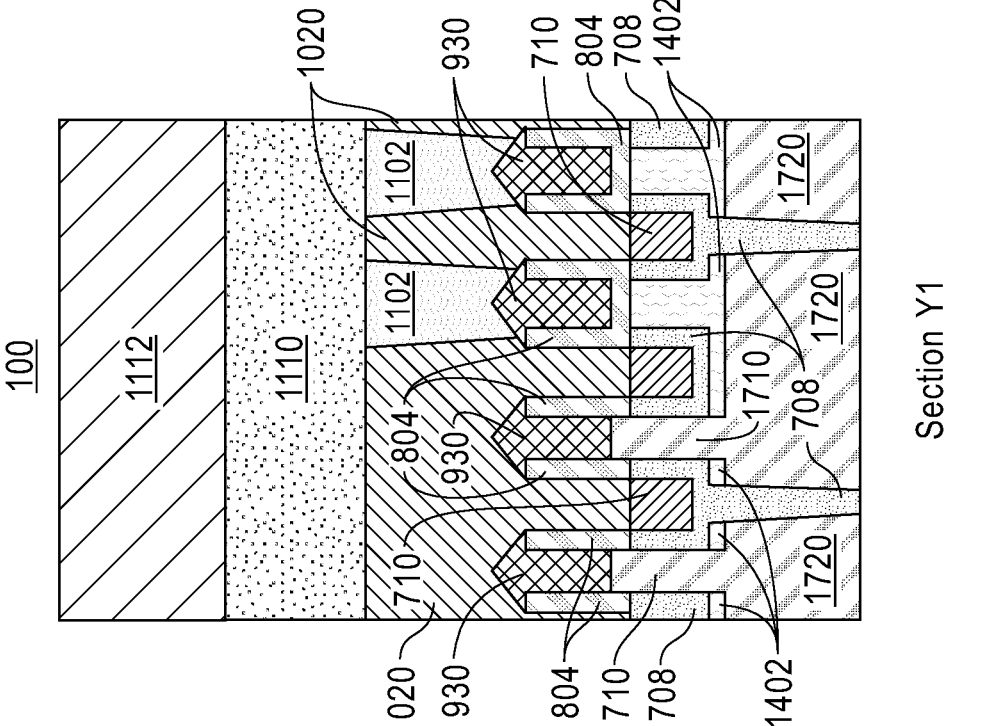
FIG. 17A is a cross-sectional view of the semiconductor structure taken along line Y1-Y1', as depicted in FIG. 1, after backside metallization, according to an embodiment of the present disclosure.
Figures 17C, 17D:
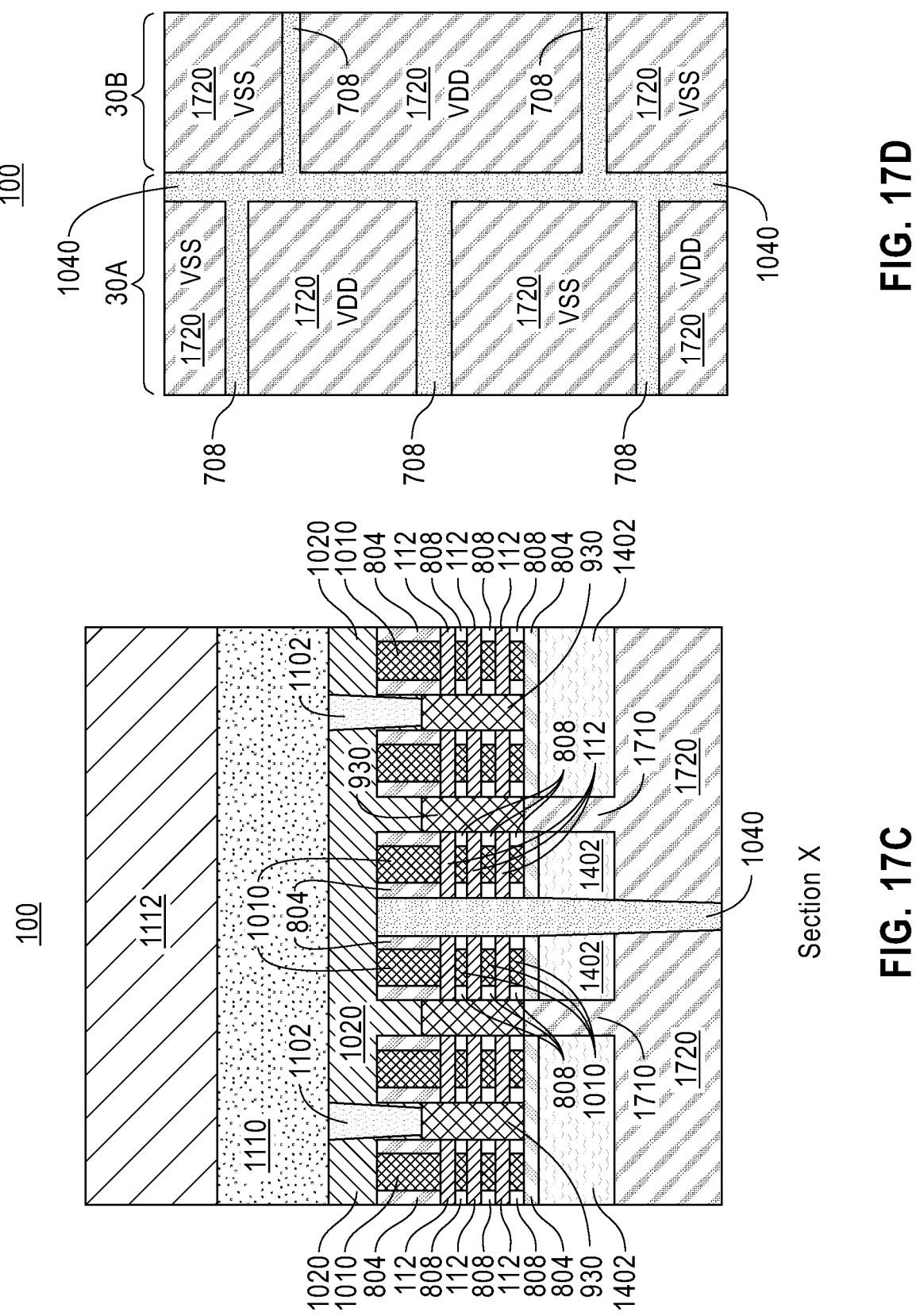
FIG. 17C is a cross-sectional view of the semiconductor structure taken along line X-X', as depicted in FIG. 1, according to an embodiment of the present disclosure.
FIG. 17D is a top-down view of the semiconductor structure, according to an embodiment of the present disclosure.

Referring now to FIGS. 17A-17C, cross-sectional views of the semiconductor structure 100 are shown after backside metallization, according to an embodiment of the present disclosure. In this embodiment, FIG. 17A is a cross-sectional view of the semiconductor structure 100 taken along line Y1-Y1', as depicted in FIG. 1; FIG. 17B is a cross-sectional view of the semiconductor structure 100 taken along line Y2-Y2', as depicted in FIG. 1; FIG. 17C is a cross-sectional view of the semiconductor structure 100 taken along line X-X', as depicted in FIG. 1, and FIG. 17D is a top-down view of the semiconductor structure 100 (after wafer flipping).

According to an embodiment, a backside metal is deposited in the semiconductor structure 100 substantially filling the fourth openings 1602 (FIGS. 16A-16C) to form backside metal contacts 1710 to one or more source/drain regions 930. In one or more embodiments, backside metal contacts 1710 can be formed between neighboring source/drain regions 930 located within NFET (i.e., N2N space) regions 12 (FIG. 1) or PFET (i.e., P2P space) regions 16 (FIG. 1) of the semiconductor structure 100. In the depicted embodiment, backside metal contacts 1710 are formed in direct contact with the first or bottom surface of one or more source/drain regions 930.

A layer of the same backside metal further deposits above the filled fourth openings 1602 (i.e., backside metal contacts 1710) and above the first BILD 1402, as depicted in the figures. This layer of backside metal formed above the backside metal contacts 1710 and the first BILD 1402 substantially surrounds a protruding portion of the STI liner 708 and the diffusion break isolation region 1040. Thus, the protruding portion of the STI liner 708 and the diffusion break isolation region 1040 electrically separates the deposited backside metal forming backside power rail (BPR) regions in the semiconductor structure 100. In the depicted embodiment, backside power rails (BPRs) 1720 can be formed in the semiconductor structure 100 at the same time as backside metal contacts 1710.

In one or more embodiments, the semiconductor structure 100 may include an NFET device. In such embodiments, the BPRs 1720 include a VSS rail embedded in the NFET region of the semiconductor structure 100 for electrically connecting to an N-type source/drain region 930 through a backside metal contact 1710 (located between adjacent N-type source/drain regions 930). In other embodiments, the semiconductor structure 100 may include a PFET device in which the BPRs 1720 include a VDD rail embedded in the PFET region of the semiconductor structure 100 that is electrically connected to a (P-type) source/drain region 930 through a backside metal contact 1710 (located between adjacent P-type source/drain regions 930).

It should be noted that source/drain regions 930 wired to backside power rails (i.e., BPRs 1720) are not connected to the BEOL interconnect level 1110. More particularly, as depicted in the figures, at least one BPR 1720 electrically connects to a source/drain region 930 of a transistor through a backside metal contact 1710, with the bottom dielectric isolation layer 806, first BILD 1402, and/or STI regions 702 electrically isolating the at least one BPR 11720 from the source/drain regions 930 not electrically connected to the backside metal contact 1710.

The backside metal used to form the backside metal contacts 1710 and BPRs 1720 may include similar conductive materials and be formed using analogous deposition processes as those used to form the metal contacts 1102. In some embodiments, forming the backside metal contacts 1710 and BPRs 1720 may include depositing, for example, a silicide liner such as Ti, Ni, NiPt, an adhesion metal liner such as TiN, and a layer of low resistance metal, such as Ru, Co, W or Cu. A thickness of the layer of backside material extending above the backside metal contacts 1710 and the first BILD 1402 may vary from approximately 30 nm to approximately 200 nm, and ranges therebetween.

With reference now to FIG. 17D, a top-down view of the semiconductor structure 100 after wafer flipping depicts self-aligned backside BPRs 1720 formed within respective first cell height area 30A and second cell height area 30B. Each BPR 1720 is separated by STI liner 708 at an N2P space 14 (FIG. 1) and at an intersection between first cell height area 30A and second cell height area 30B by the diffusion break isolation region 1040 providing the grid shaped configuration depicted in FIG. 17D. Thus, the proposed embodiments provide a semiconductor structure with a hybrid and flexible cell height. Additionally, embodiments of the present disclosure may, among other benefits, allow patterning complex backside metal interconnects (BM1) without using backside EUV or other high-cost lithography process, form very small BM1 within side-by-side space, and increase VDD/VSS coupling capacitance.

Figure 18B:
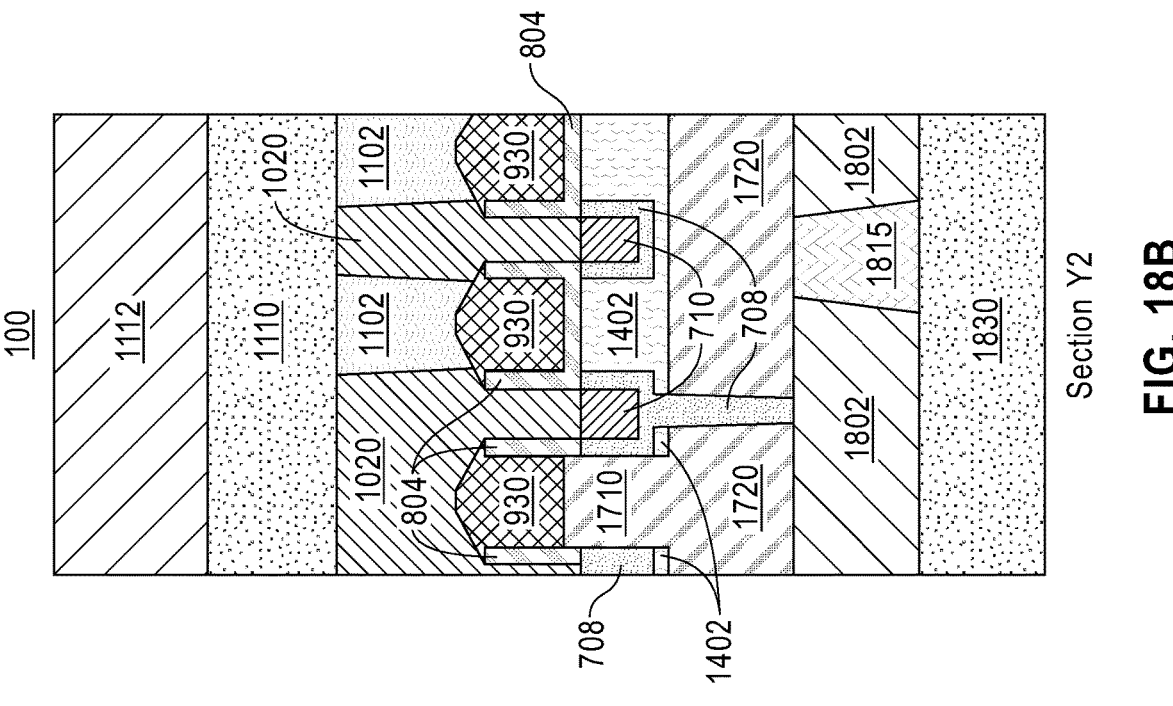
FIG. 18B is a cross-sectional view of the semiconductor structure taken along line Y2-Y2', as depicted in FIG. 1, according to an embodiment of the present disclosure.
Figure 18A:
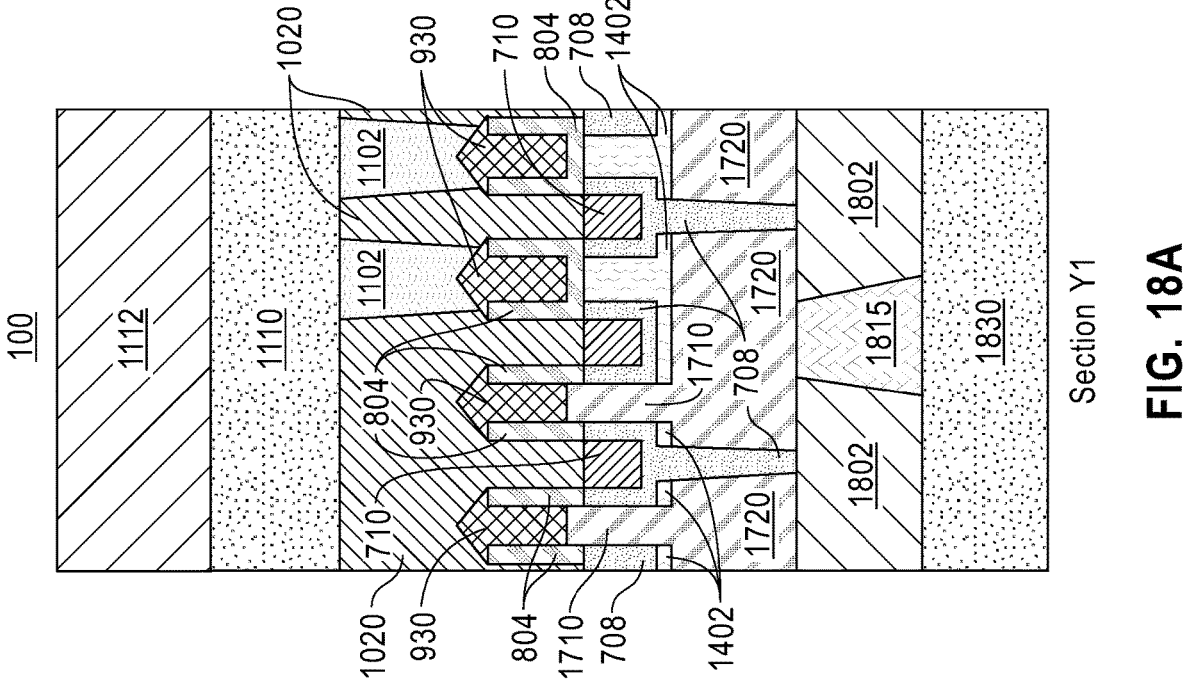
FIG. 18A is a cross-sectional view of the semiconductor structure taken along line Y1-Y1', as depicted in FIG. 1, after forming a backside power delivery network (BSPDN), according to an embodiment of the present disclosure.
Figure 18C:
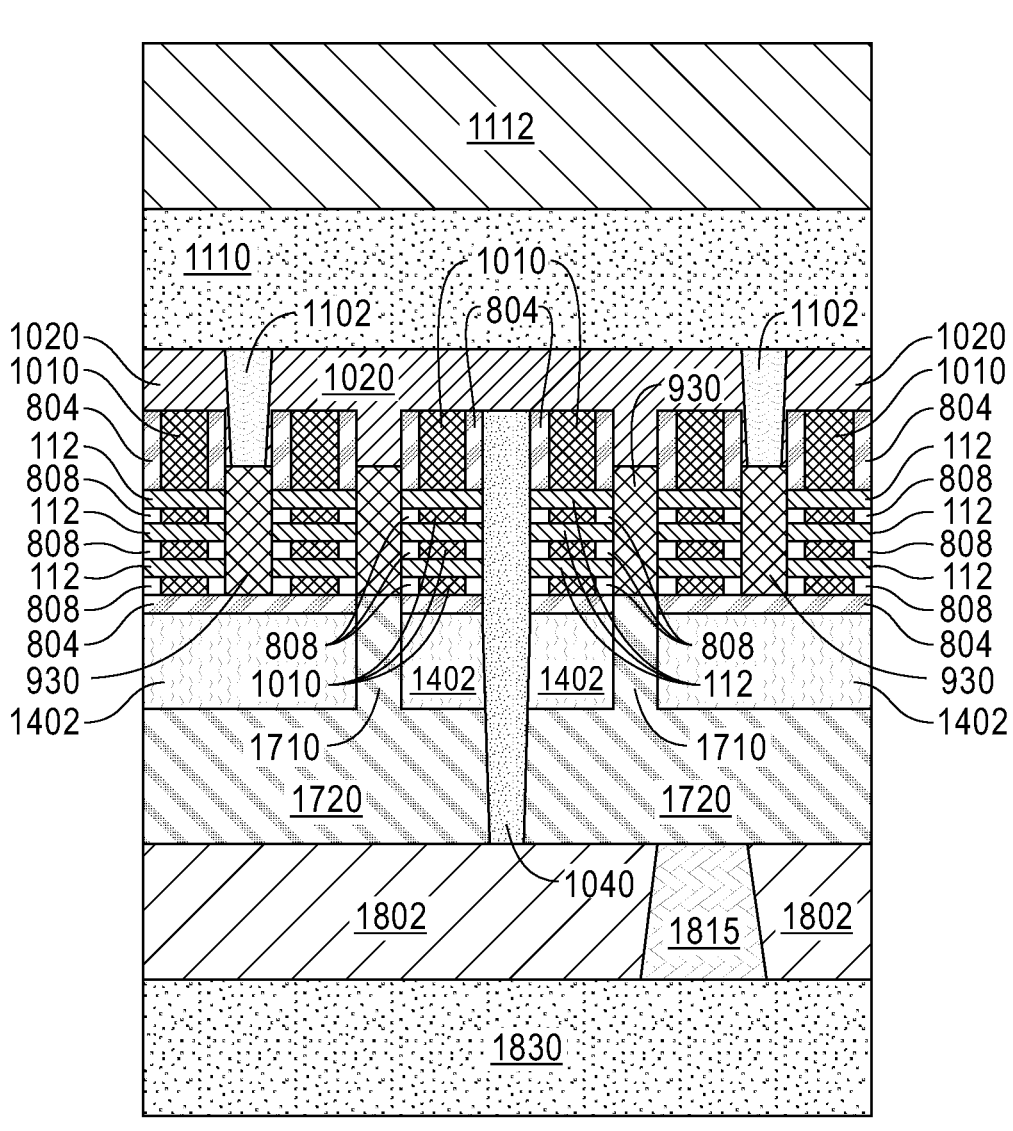
FIG. 18C is a cross-sectional view of the semiconductor structure 100 taken along line X-X', as depicted in FIG. 1, according to an embodiment of the present disclosure.

Referring now to FIGS. 18A-18C, cross-sectional views of the semiconductor structure 100 are shown after forming a backside power delivery network (BSPDN) 1830, according to an embodiment of the present disclosure. In this embodiment, FIG. 18A is a cross-sectional view of the semiconductor structure 100 taken along line Y1-Y1', as depicted in FIG. 1; FIG. 18B is a cross-sectional view of the semiconductor structure 100 taken along line Y2-Y2', as depicted in FIG. 1; and FIG. 18C is a cross-sectional view of the semiconductor structure 100 taken along line X-X', as depicted in FIG. 1.

In one or more embodiments, voids within the semiconductor structure 100 may be filled by depositing a second BILD 1802 substantially similar to the first BILD 1402. Further, the second BILD 1802 may electrically isolate the BPRs 1720. A planarization process can be conducted in the semiconductor structure 100 after depositing the second BILD 1802. In the depicted embodiment, the backside vias (or BV1) 1815 are formed within the second BILD 1802 for electrically connecting one or more BPRs 1720 the BSPDN 1830. It should be noted that the process of forming the backside vias 1815 is standard and well-known in the art.

In one or more embodiments, a structure of the BSPDN 1830 can be made according to known techniques and may be selected based on the exact function of the transistor arrangement.

It should be noted that the BEOL interconnect level 1110 in the semiconductor structure 100 manufactured according to the disclosed technology is separated from the BSPDN 1830, thereby increasing the routing resources in the semiconductor structure 100 for signal wirings in the BEOL level.

Therefore, embodiments of the present disclosure provide a semiconductor structure including a first plurality of backside power rail interconnects located within a first cell height region of a substrate electrically separated from a second plurality of backside power rail interconnects located within a second cell height region of the substrate by a first isolation region, each of the first plurality of backside power rail interconnects and each of the second plurality of backside power rail interconnects being separated from one another by a second isolation region. Stated differently, the first isolation region located between the first cell height region of the substrate and the second cell height region of the substrate electrically separates the first cell height region and the second cell height region while the second isolation region located between adjacent power rail interconnects of the first plurality of backside power rail interconnects and between adjacent power rail interconnects of the second plurality of backside power rail interconnects electrically separates the adjacent power rail interconnects.

According to an embodiment, the first plurality of backside power rail interconnects and the second plurality of backside power rail interconnects are configured in a grid shaped arrangement. In one or more embodiments, the first isolation region includes a diffusion break isolation region and the second isolation region includes a dielectric liner extending from a shallow trench isolation region with a critical dimension of the dielectric liner being less than a critical dimension of the shallow trench isolation region.

According to an embodiment, each of the first plurality of backside power rail interconnects and each of the second plurality of backside power rail interconnects are electrically separated at an N2P space by the dielectric liner extending from the shallow trench isolation region.

According to an embodiment, the first plurality of backside power rail interconnects and the second plurality of backside power rail interconnects are located between a device region and a backside power delivery network.

According to an embodiment, the backside power delivery network is electrically connected to at least one of the first plurality of backside power rail interconnects and the second plurality of backside power rail interconnects by a backside via.

According to an embodiment, one or more of the first plurality of backside power rail interconnects and the second plurality of backside power rail interconnects are electrically connected to the device region by a backside metal contact.

According to an embodiment, the device region further includes a front-end-of-line level including one or more field effect transistors, the front-end-of-line level electrically connected to a back-end-of-line interconnect level located on a first side of the front-end-of-line level by a plurality of metal contacts, the one or more field effect transistors being electrically separated by the shallow trench isolation region.

According to an embodiment, the semiconductor structure further includes a carrier wafer in contact with a surface of the back-end-of-line interconnect level opposing the one or more field effect transistors and the plurality of metal contacts.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a first plurality of backside power rail interconnects located within a first cell height region of a substrate;

a second plurality of backside power rail interconnects located within a second cell height region of the substrate;

a first isolation region located between the first cell height region of the substrate and the second cell height region of the substrate, the first isolation region electrically separating the first cell height region and the second cell height region; and a second isolation region located between adjacent power rail interconnects of the first plurality of backside power rail interconnects and between adjacent power rail interconnects of the second plurality of backside power rail interconnects, the second isolation region electrically separating the adjacent power rail interconnects, wherein the first plurality of backside power rail interconnects and the second plurality of backside power rail interconnects connect with a plurality of backside power rails, and the plurality of backside power rails form a grid shape separated by the first isolation region and the second isolation region.

2. The semiconductor structure of claim 1, wherein the first plurality of backside power rail interconnects and the second plurality of backside power rail interconnects are configured in a grid shaped arrangement.

3. The semiconductor structure of claim 1, wherein the first isolation region includes a diffusion break isolation region.

4. The semiconductor structure of claim 1, wherein the second isolation region includes a dielectric liner extending from a shallow trench isolation region.

5. The semiconductor structure of claim 4, wherein a critical dimension of the dielectric liner is less than a critical dimension of the shallow trench isolation region.

6. The semiconductor structure of claim 4, wherein each of the first plurality of backside power rail interconnects and each of the second plurality of backside power rail interconnects are electrically separated at an N2P space by the dielectric liner extending from the shallow trench isolation region.

7. The semiconductor structure of claim 1, wherein the first plurality of backside power rail interconnects and the second plurality of backside power rail interconnects are located between a device region and a backside power delivery network.

8. The semiconductor structure of claim 7, wherein the backside power delivery network is electrically connected to at least one of the first plurality of backside power rail interconnects and the second plurality of backside power rail interconnects by a backside via.

9. The semiconductor structure of claim 8, wherein the device region further includes:

a front-end-of-line level comprising one or more field effect transistors, the front-end-of-line level electrically connected to a back-end-of-line interconnect level located on a first side of the front-end-of-line level by a plurality of metal contacts, the one or more field effect transistors being electrically separated by a shallow trench isolation region.

10. The semiconductor structure of claim 9, further comprising:

a carrier wafer in contact with a surface of the back-end-of-line interconnect level opposing the one or more field effect transistors and the plurality of metal contacts.

11. The semiconductor structure of claim 7, wherein one or more of the first plurality of backside power rail interconnects and the second plurality of backside power rail interconnects are electrically connected to the device region by a backside metal contact.

* * * * *